(12) United States Patent
Takano et al.

(10) Patent No.: US 11,369,024 B2
(45) Date of Patent: Jun. 21, 2022

(54) PRODUCING METHOD OF WIRING CIRCUIT BOARD AND WIRING CIRCUIT BOARD ASSEMBLY SHEET

(71) Applicant: NITTO DENKO CORPORATION, Osaka (JP)

(72) Inventors: Takahiro Takano, Osaka (JP); Kazushi Ichikawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/090,203

(22) Filed: Nov. 5, 2020

(65) Prior Publication Data
US 2021/0144859 A1    May 13, 2021

(30) Foreign Application Priority Data
Nov. 11, 2019   (JP) .............................. JP2019-203754

(51) Int. Cl.
*H05K 1/02*     (2006.01)
*H05K 1/14*     (2006.01)
*H05K 3/02*     (2006.01)

(52) U.S. Cl.
CPC ........... *H05K 3/027* (2013.01); *H05K 1/0266* (2013.01)

(58) Field of Classification Search
CPC combination set(s) only.
See application file for complete search history.

(56) References Cited

U.S. PATENT DOCUMENTS

| 7,081,590 B2 * | 7/2006 | Yuzawa | H01L 23/544 |
| | | | 174/250 |
| 7,563,986 B2 * | 7/2009 | Shitamura | H05K 3/0097 |
| | | | 174/268 |
| 2004/0256150 A1 * | 12/2004 | Barchmann | G06K 19/07743 |
| | | | 174/266 |
| 2007/0241764 A1 * | 10/2007 | Naito | H05K 1/0269 |
| | | | 324/759.02 |
| 2008/0003849 A1 * | 1/2008 | Cherian | G01R 1/07357 |
| | | | 439/82 |
| 2011/0048785 A1 * | 3/2011 | Ishii | H05K 3/303 |
| | | | 29/830 |
| 2011/0061900 A1 * | 3/2011 | Umetani | H05K 3/0097 |
| | | | 174/250 |
| 2012/0033395 A1 * | 2/2012 | Ishii | H05K 3/4644 |
| | | | 29/829 |

(Continued)

FOREIGN PATENT DOCUMENTS

| JP | 2005-286207 A | 10/2005 |
| JP | 2018-092966 A | 6/2018 |
| JP | 2019-047102 A | 3/2019 |

*Primary Examiner* — Hoa C Nguyen
(74) *Attorney, Agent, or Firm* — Edwards Neils LLC; Jean C. Edwards, Esq

(57) ABSTRACT

In a method for producing a wiring circuit board, a conductive pattern is formed using a plating resist formed by photolithography for sequentially moving one photomask in a first direction with respect to a dry film resist to be exposed a plurality of times. The conductive pattern has a conductive intermediate portion which is inclined. The one photomask has a third photo pattern. The third photo pattern includes a first photoline pattern and a second photo line pattern. A first portion of the first photoline pattern coincides with a second portion of the second photoline pattern when projected in the first direction.

2 Claims, 22 Drawing Sheets

(56) References Cited

U.S. PATENT DOCUMENTS

2012/0152592 A1* 6/2012 Ishii .................. H05K 1/056
 29/829
2014/0239318 A1* 8/2014 Oyu .................. H01L 33/486
 257/98

* cited by examiner

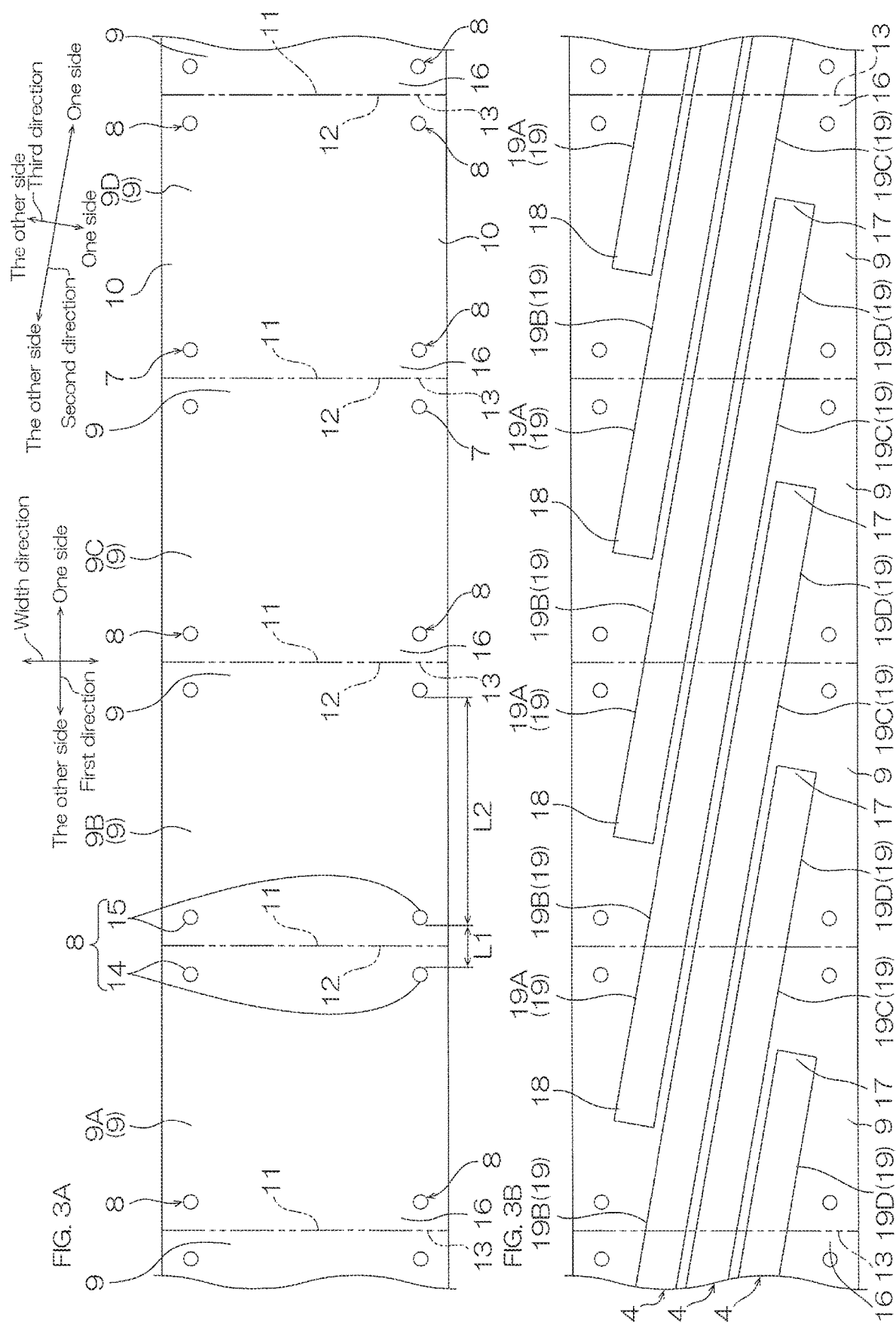

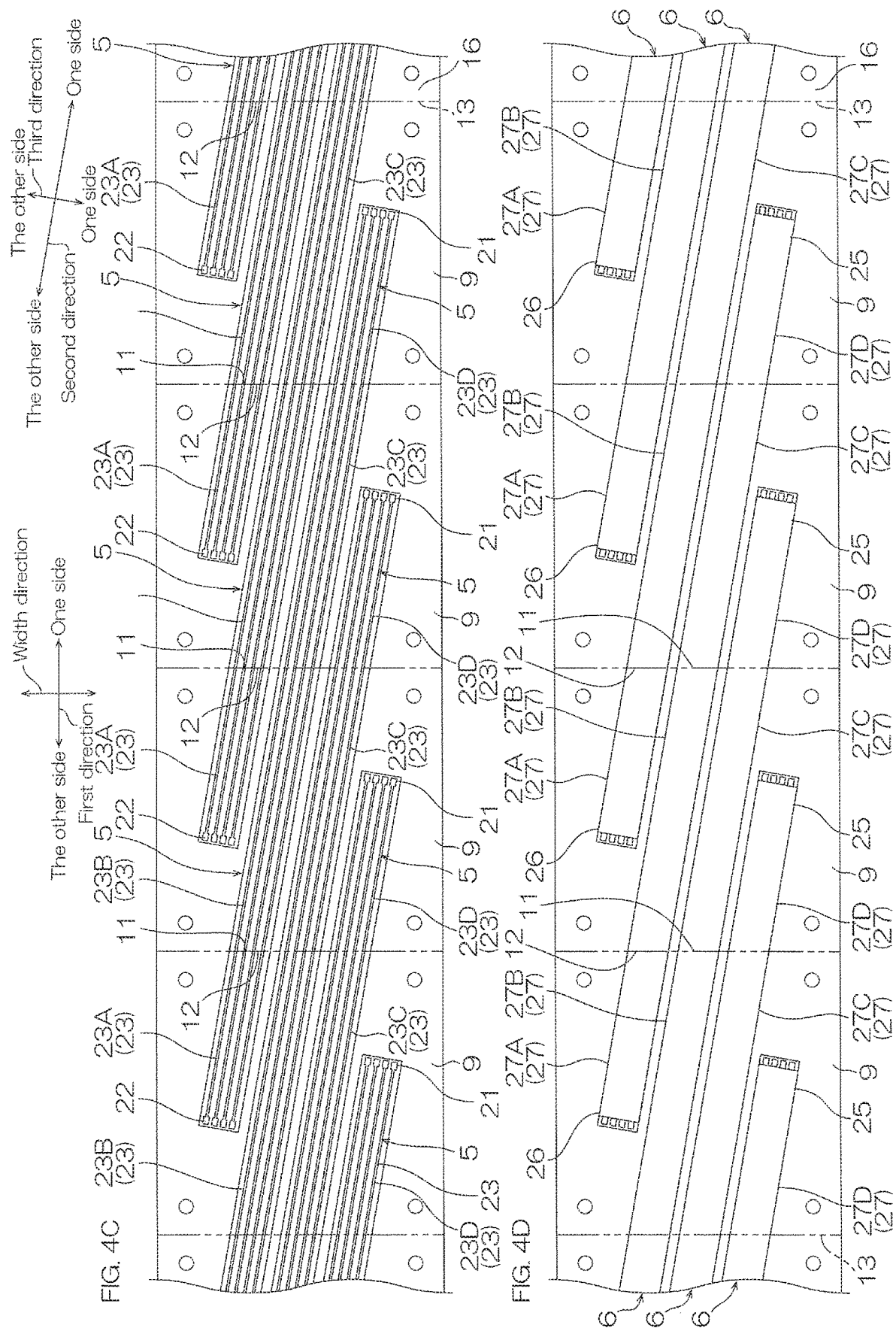

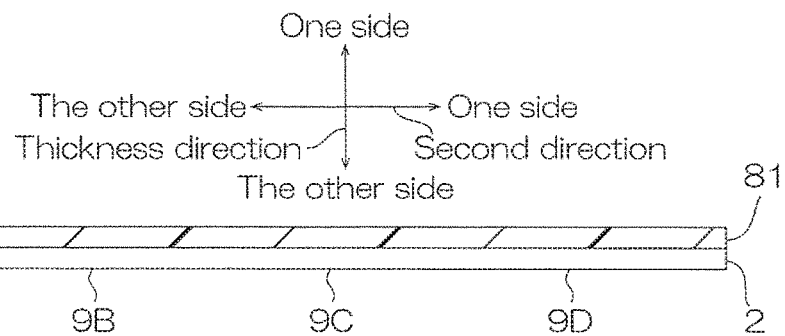
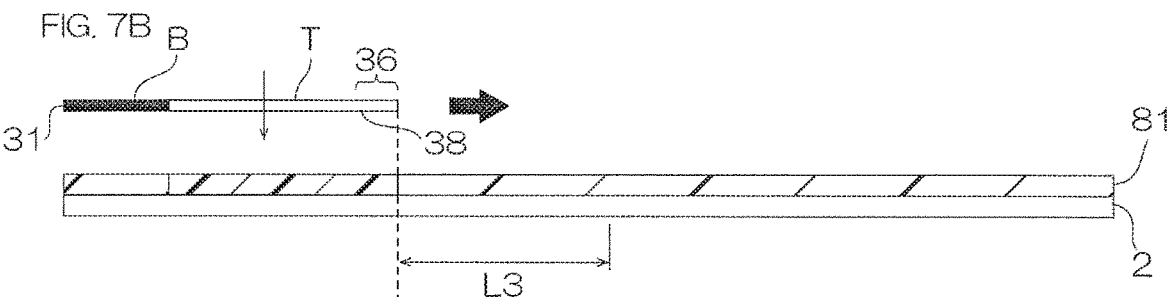
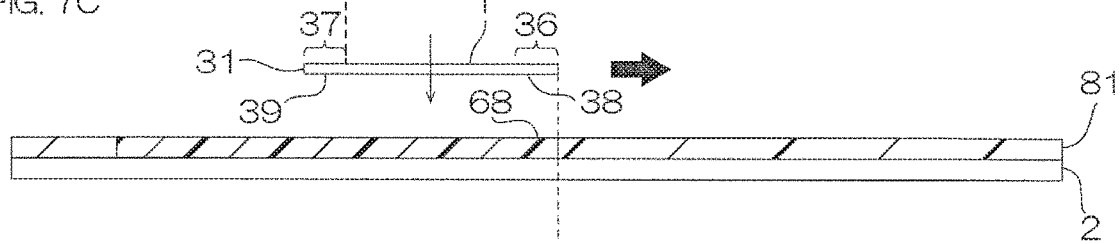
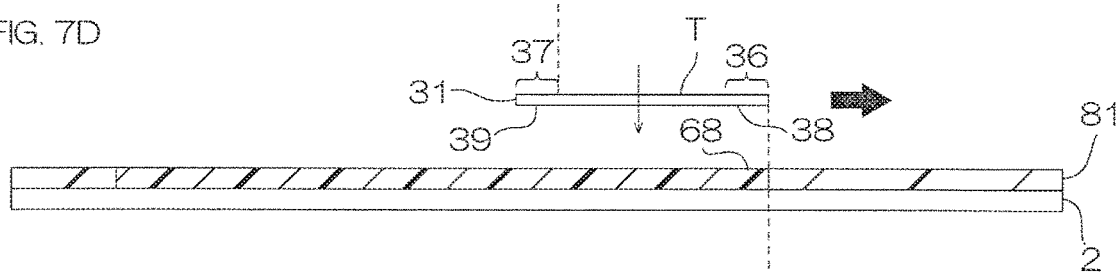
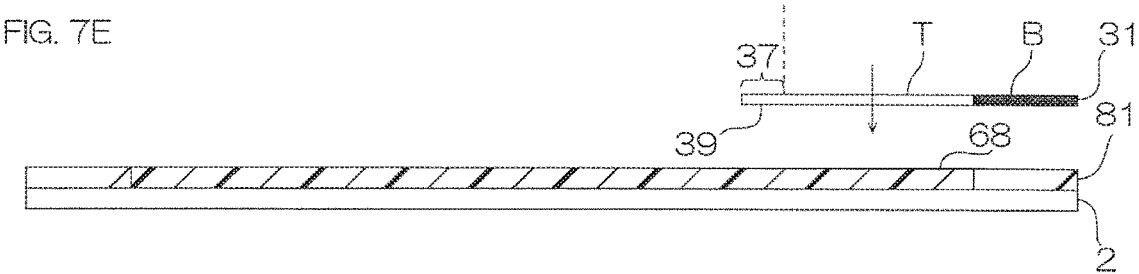
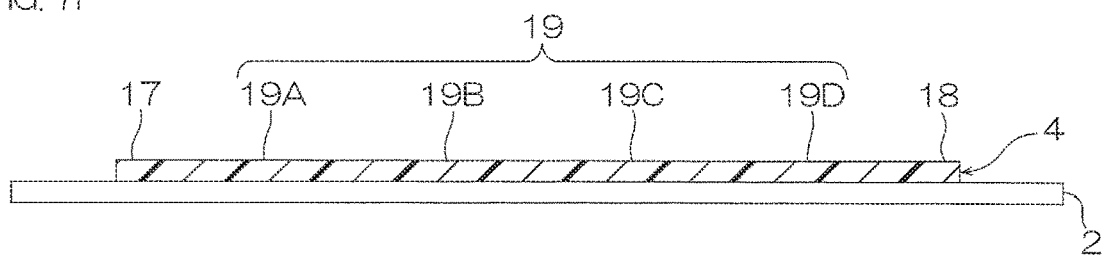

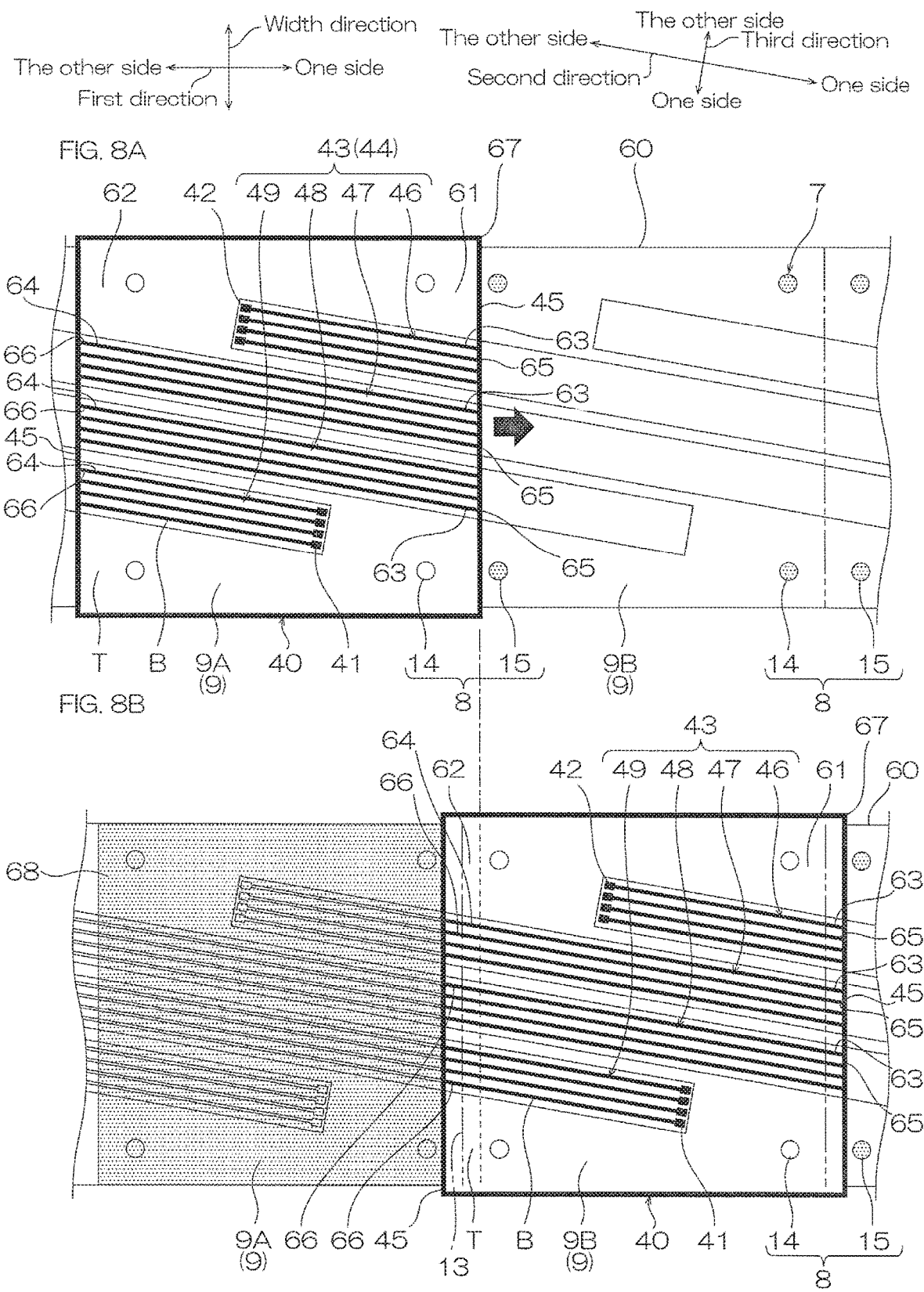

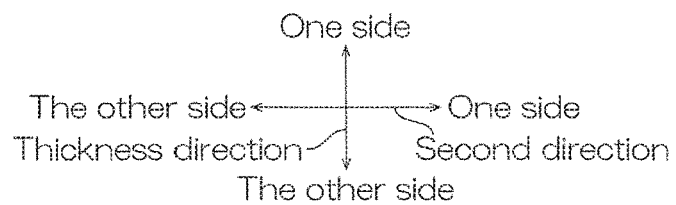
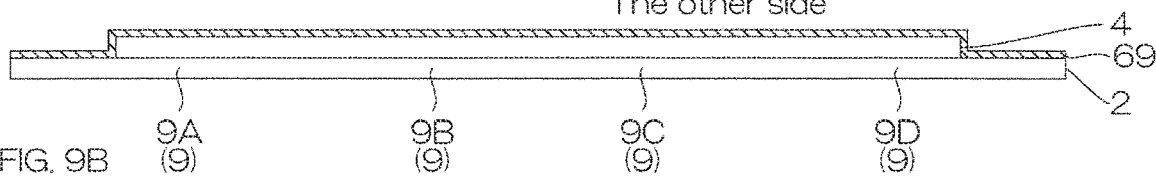
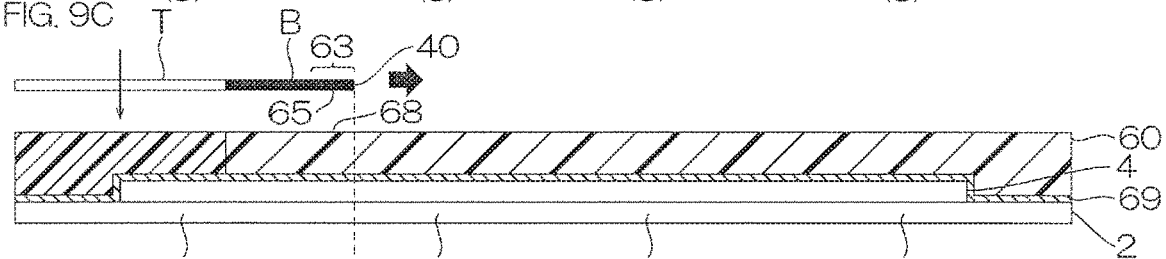
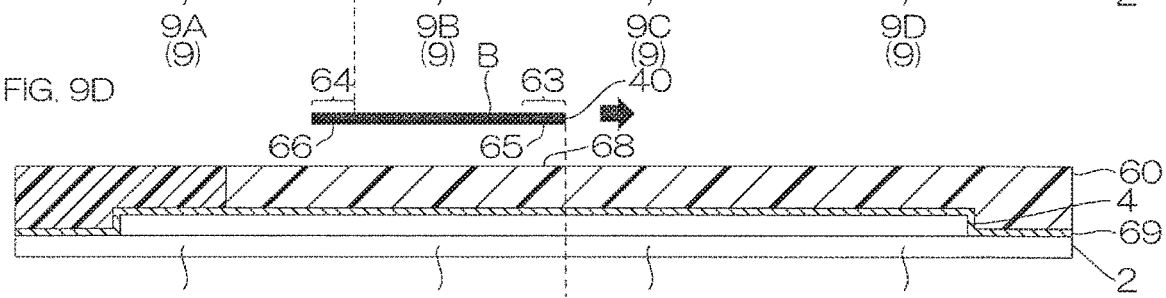
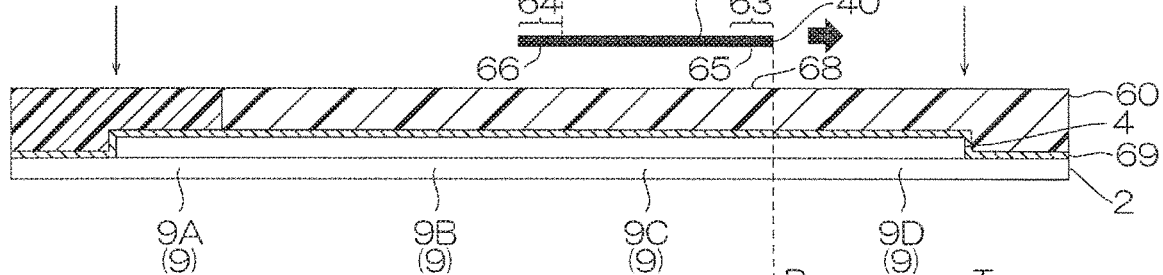
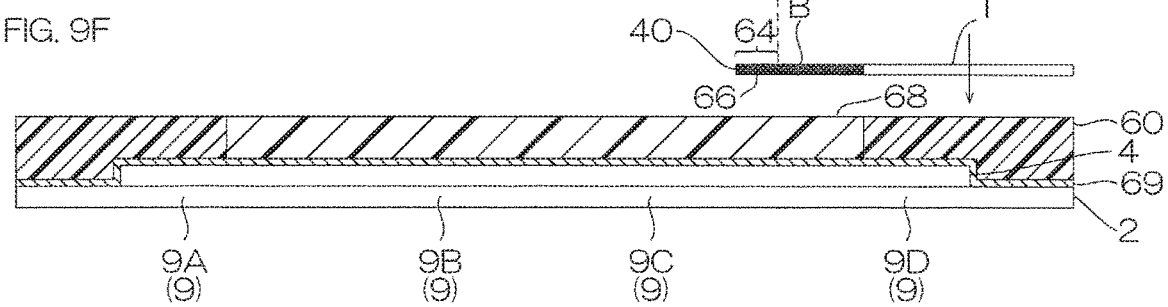

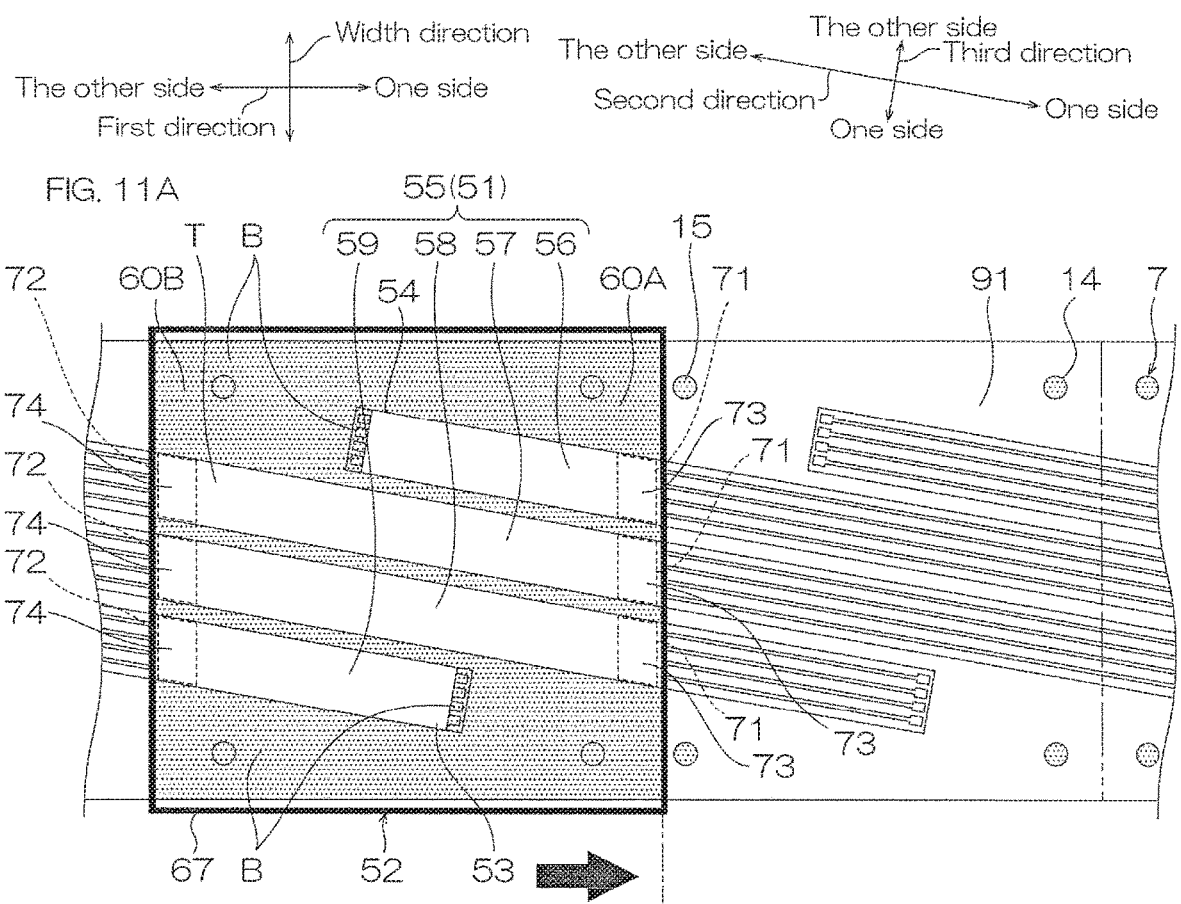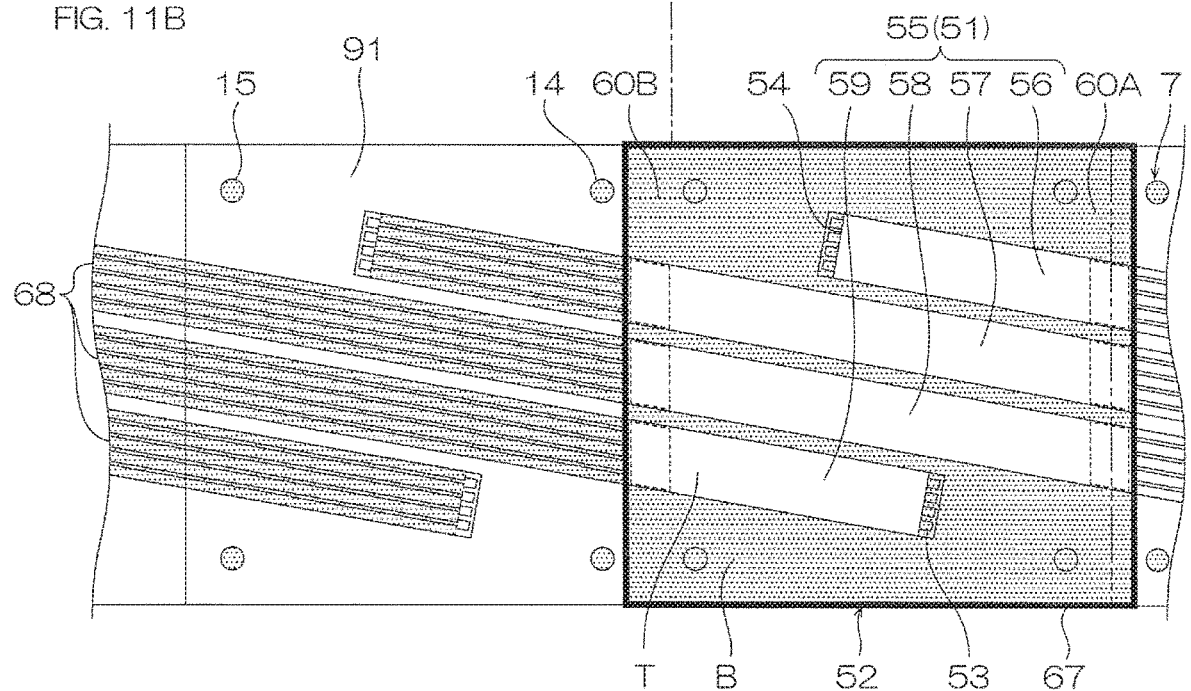

FIG. 12A
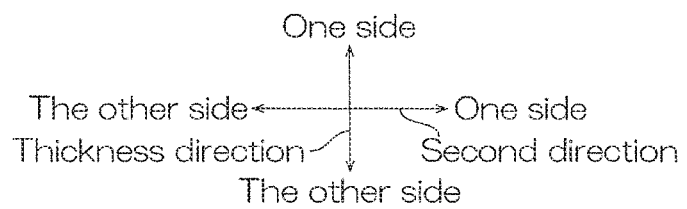
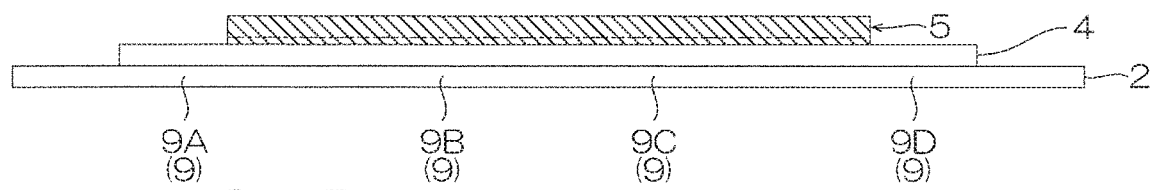
FIG. 12B
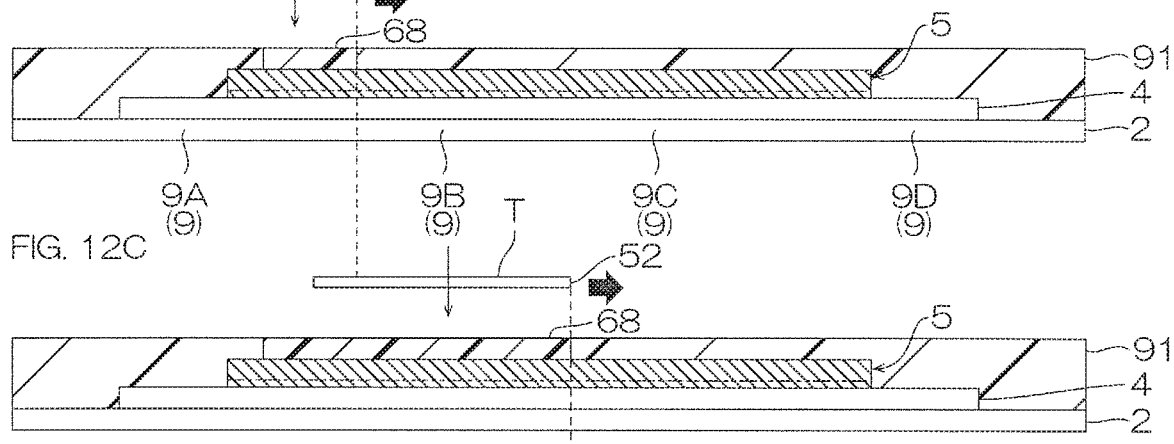
FIG. 12C
FIG. 12D
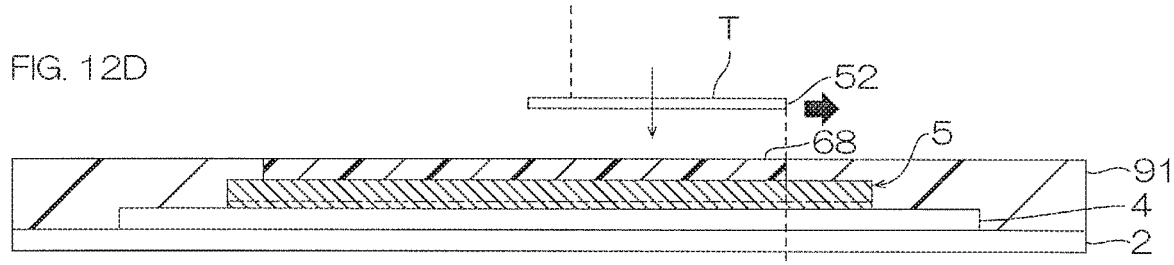
FIG. 12E
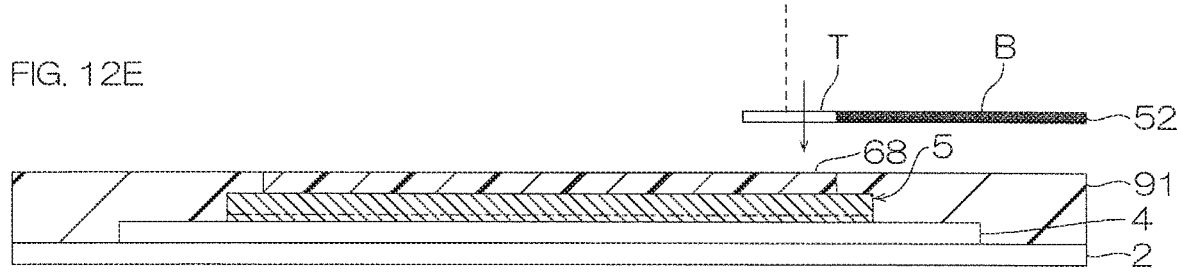
FIG. 12F
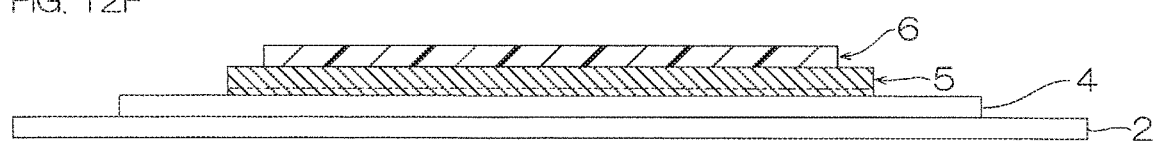

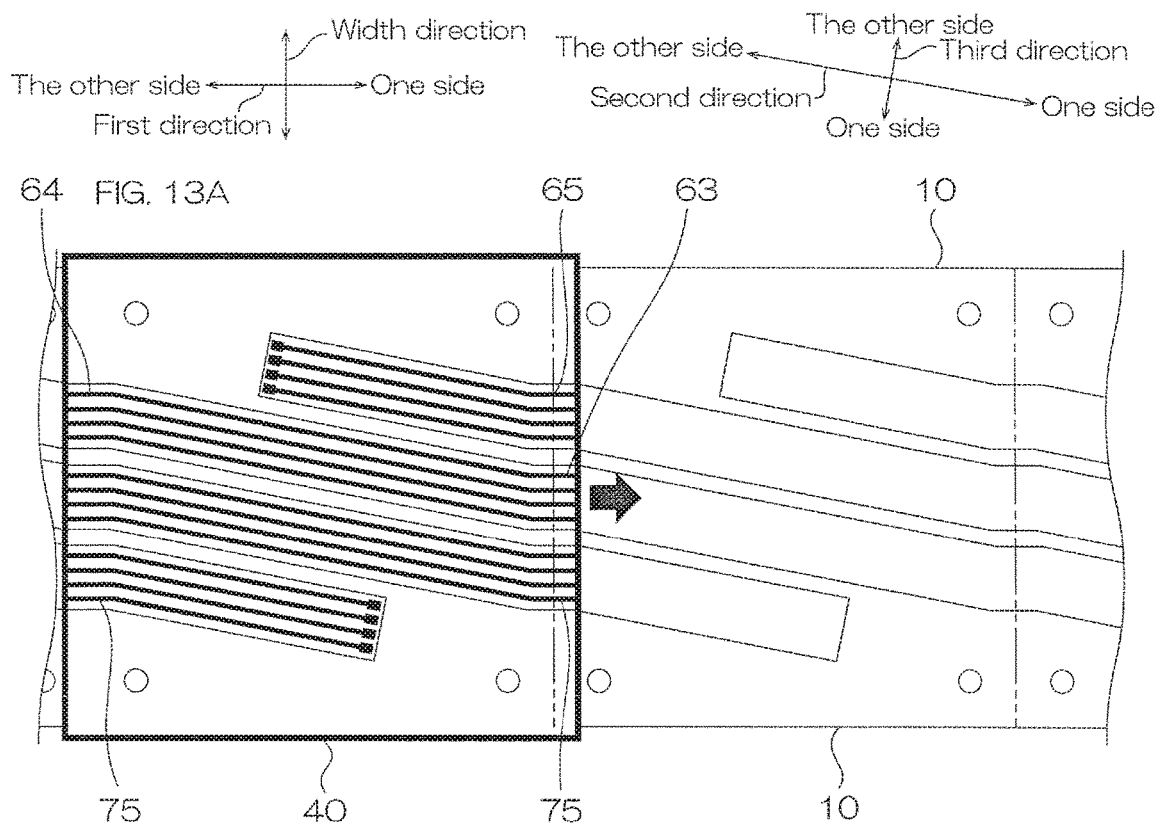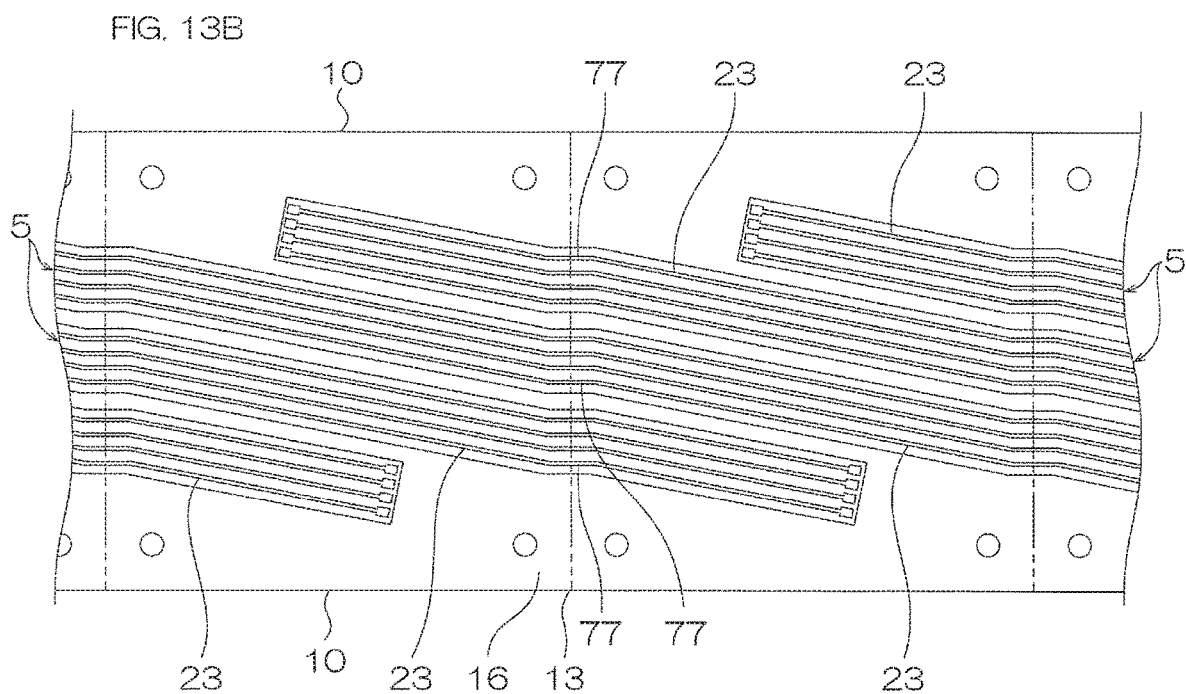

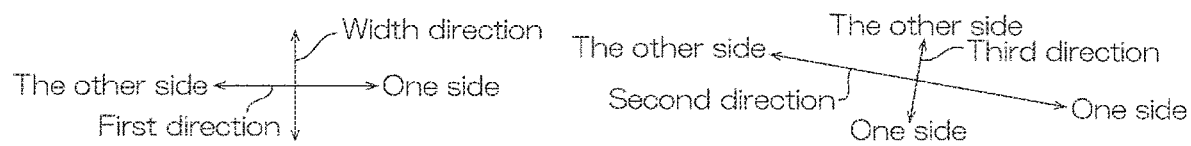
FIG. 18A
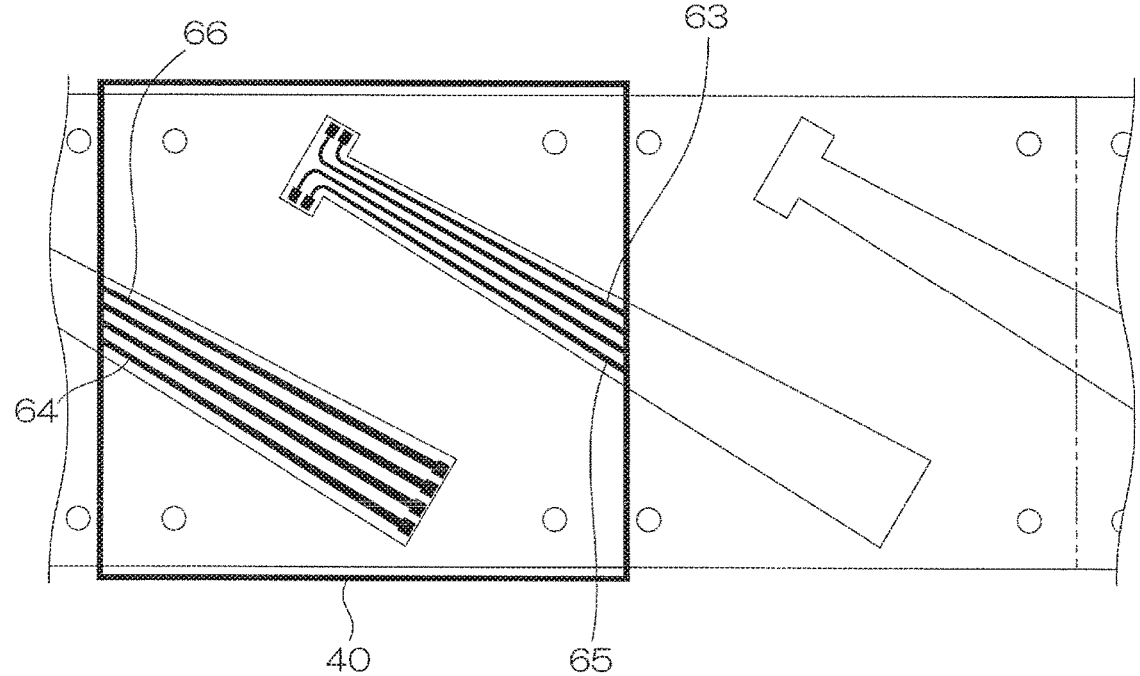
FIG. 18B
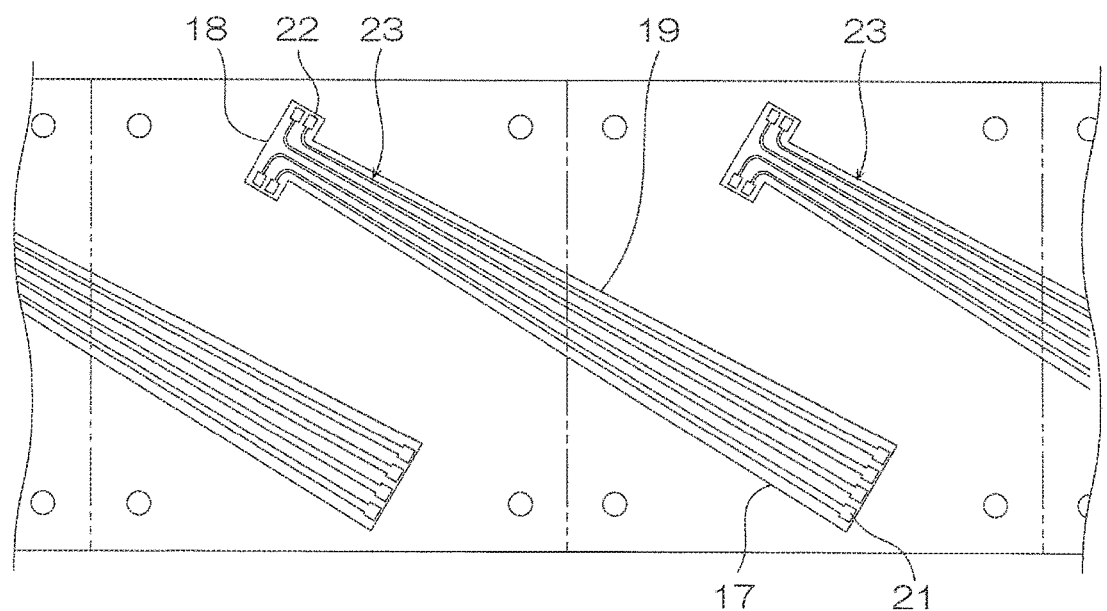

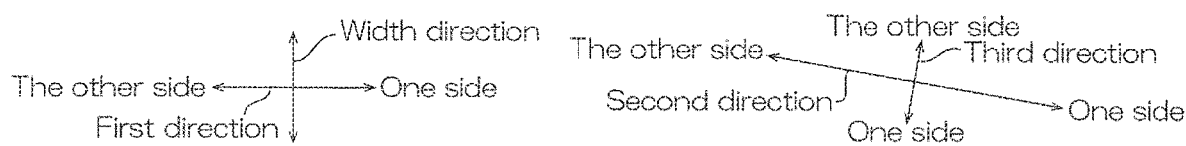
FIG. 19A
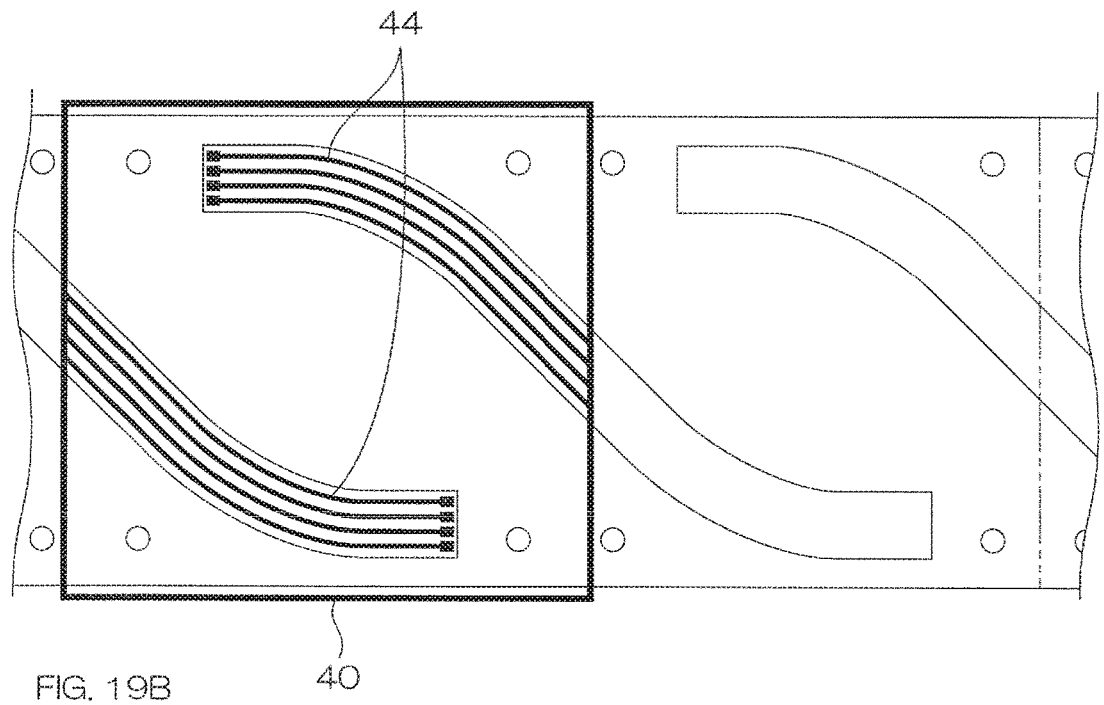
FIG. 19B
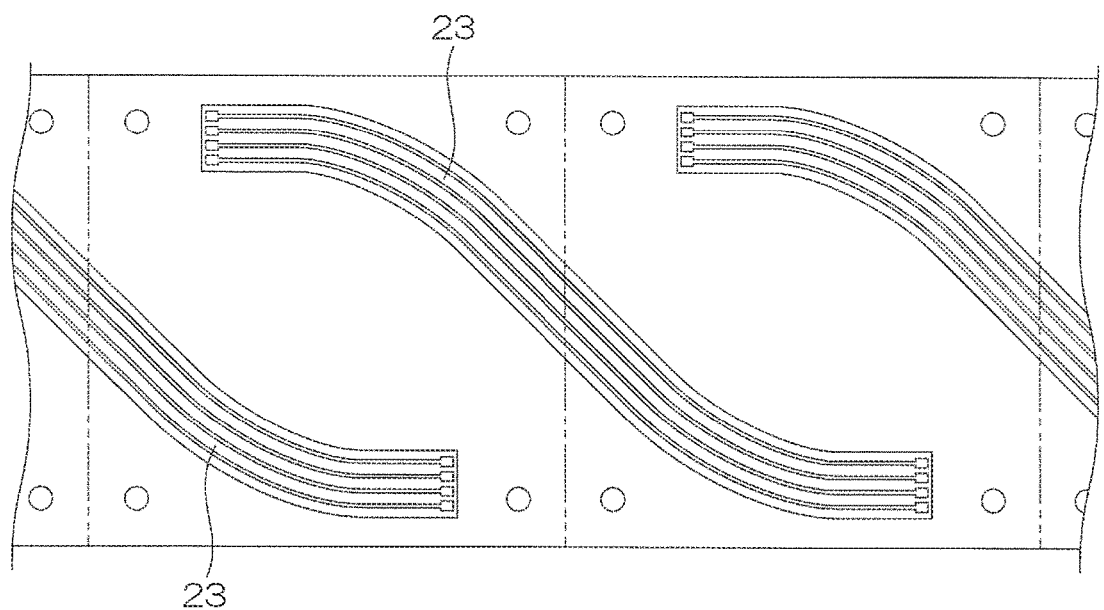

PRODUCING METHOD OF WIRING CIRCUIT BOARD AND WIRING CIRCUIT BOARD ASSEMBLY SHEET

CROSS REFERENCE TO RELATED APPLICATION

The present application claims priority from Japanese Patent Application No. 2019-203754 filed on Nov. 11, 2019, the contents of which are hereby incorporated by reference into this application.

TECHNICAL FIELD

The present invention relates to a method for producing a wiring circuit board, and a wiring circuit board assembly sheet.

BACKGROUND ART

Conventionally, a method for producing a flexible substrate for forming a wiring pattern in an insulating layer by a pattern forming method of an additive method or a subtractive method has been known.

For example, as a method for forming the wiring pattern by the subtractive method, a method in which an exposure mask having an opening portion of an equal length of a width of both end portions is provided on a photosensitive resist layer disposed on the surface of a metal layer so as to sequentially overlap end portions of the opening portion in a longitudinal direction, and the resist layer is repeatedly exposed has been proposed (ref: for example, Patent Document 1 below).

In Patent Document 1, the opening portion of the exposure mask has a linear shape when viewed from the top along the longitudinal direction, and has the same width over the longitudinal direction.

In Patent Document 1, by development after exposure, a resist pattern having a linear shape of the same width over the longitudinal direction is formed, and then, by etching the metal layer exposed from the resist pattern, a wiring pattern having a linear shape of the same width over the longitudinal direction is formed.

PRIOR ART DOCUMENT

Patent Document

[Patent Document 1] Japanese Unexamined Patent Publication No. 2005-286207

SUMMARY OF THE INVENTION

Problems to be Solved by the Invention

However, a terminal pattern in addition to the wiring pattern may be formed in a conductive layer. The terminal pattern usually has a wider land shape than the wiring pattern from the viewpoint of improving the connection reliability with other electrical substrates. Then, in the method of Patent Document 1, when the exposure mask corresponding to the wire is sequentially overlapped to be disposed in the longitudinal direction, the wiring pattern can be formed, and the terminal pattern cannot be formed in the shape described above.

On the other hand, when the exposure mask corresponding to the terminal pattern is sequentially overlapped to be disposed in the longitudinal direction, the pattern terminal can be formed, and the wiring pattern cannot be formed, and moreover, since a terminal is usually disposed in the end portion of the wiring pattern, the wiring pattern is discontinuous in the longitudinal direction.

In view of the description above, it is devised to separately prepare an exposure mask corresponding to a wiring pattern and an exposure mask corresponding to a terminal pattern.

However, in this trial plan, in the exposure step, the photosensitive resist layer in the area corresponding to the wiring pattern is exposed through the exposure mask corresponding to the wiring pattern, then, the exposure mask is replaced, and thereafter, the photosensitive resist layer in the area corresponding to the terminal pattern is exposed through the exposure mask corresponding to the terminal pattern. Therefore, there is a problem that the number of components of a production device increases, and also, the replacement of the exposure mask becomes troublesome.

The present invention provides a method for producing a wiring circuit board which has a conductive one end portion and/or a conductive other end portion capable of having a different shape from a conductive intermediate portion, while the number of components of a production device decreases, and can easily form a conductive pattern having excellent reliability, and a wiring circuit board assembly sheet.

Solution to the Problems

The present invention (1) includes a method for producing a wiring circuit board including a conductive pattern and an insulating layer adjacent to the conductive pattern in a thickness direction including the steps of forming the insulating layer and forming the conductive pattern using a resist formed by photolithography for sequentially moving one photomask in a first direction with respect to a photoresist to be exposed a plurality of times, wherein the conductive pattern has a conductive one end portion, a conductive other end portion, and a conductive intermediate portion; the conductive intermediate portion extends in a second direction inclined with respect to the first direction; the one photomask has a first photo pattern corresponding to the conductive one end portion, a second photo pattern corresponding to the conductive other end portion, and a third photo pattern corresponding to the conductive intermediate portion; the third photo pattern includes a plurality of photoline patterns disposed adjacent to each other at spaced intervals in a third direction perpendicular to the second direction in the one photomask; the plurality of photoline patterns include a first end portion located in a first directional one end portion of the one photomask and a second end portion located in a first directional other end portion of the one photomask; and of the plurality of photoline patterns, a first portion included in a portion located in the first end portion of one photoline pattern coincides with a second portion included in a portion located in the second end portion of the other photoline pattern adjacent to one photoline pattern in the third direction when projected in the first direction.

In the method for producing a wiring circuit board, the first portion of one photoline pattern in the plurality of photoline patterns coincides with the second portion of the other photoline pattern when projected in the first direction. Therefore, the conductive intermediate portion can be continuous in the second direction. Further, even when the shape of the first photo pattern and/or the second photo pattern is different from the shape of the third photo pattern, since the first portion coincides with the second portion, the conductive intermediate portion also can be continuous in the second direction. As a result, it is possible to form the conductive pattern having the conductive one end portion and/or the conductive other end portion which can have a different shape from the conductive intermediate portion and having excellent reliability.

Further, since the one photomask is sequentially moved in the first direction to expose the photoresist a plurality of times, it is possible to easily form the conductive pattern described above, while the number of components of the production device is reduced.

The present invention (2) includes the method for producing a wiring circuit board described in (1), wherein in the step of forming the conductive pattern, in the photoresist, a portion facing the first end portion of the one photomask at the time of the n-th time (n is a natural number) exposure is overlapped with a portion facing the second end portion of the one photomask at the time of the [n+1]th time exposure.

However, in the photoresist used in the step of forming the conductive pattern, when the portion facing the first directional one end portion in the one photomask at the time of the n-th time exposure is not overlapped with the portion facing the first directional other end portion in the one photomask at the time of the [n+1]th time, there may be a case where the conductive intermediate portion easily becomes discontinuous, and the reliability of the conductive pattern is reduced.

On the other hand, in this producing method, since the two portions are overlapped, even when the one photomask is sequentially moved in the first direction, the two portions can be reliably continuous, therefore, the conductive intermediate portion is reliably continuous, and it is possible to suppress a decrease in reliability of the conductive pattern.

The present invention (3) includes the method for producing a wiring circuit board described in (1) or (2), wherein a length in the second direction of the conductive pattern is 300 mm or more.

In the photolithography for exposing the one photomask once, the conductive pattern having a short length in the second direction of below 300 mm can be formed, and there may be a case where the conductive pattern having a long length in the second direction of 300 mm or more cannot be formed.

However, in the method for producing a wiring circuit board, since the photolithography for sequentially moving the one photomask in the first direction to be exposed a plurality of times is carried out, it is possible to form the long conductive pattern having excellent reliability.

The present invention (4) includes the method for producing a wiring circuit board described in any one of (1) to (3), wherein in the step of forming the insulating layer, photolithography for sequentially moving one second photomask in the first direction with respect to a photosensitive precursor layer to be exposed a plurality of times is carried out; the insulating layer has an insulating one end portion corresponding to the conductive one end portion, an insulating other end portion corresponding to the conductive other end portion, and an insulating intermediate portion corresponding to the conductive intermediate portion; the insulating intermediate portion extends in the second direction; the one second photomask has a fourth photo pattern corresponding to the insulating one end portion, a fifth photo pattern corresponding to the insulating other end portion, and a sixth photo pattern corresponding to the insulating intermediate portion; in the one second photomask, the sixth photo pattern includes a plurality of photo patterns disposed adjacent to each other at spaced intervals in the third direction; the plurality of photo patterns include a third end portion located in a first directional one end portion of the one second photomask and a fourth end portion located in a first directional other end portion of the one second photomask; and of the plurality of photo patterns, a third portion included in a portion located in the third end portion of one photo pattern coincides with a fourth portion included in a portion located in the fourth end portion of the other photo pattern adjacent to one photo pattern in the third direction when projected in the first direction.

In the method for producing a wiring circuit board, in the plurality of photo patterns, the third portion included in the portion located in the third end portion of one photo pattern coincides with the fourth portion included in the portion located in the fourth end portion of the other photo pattern. Therefore, the insulating intermediate portion is continuous in the second direction. Further, even when the shape of the fourth photo pattern and/or the fifth photo pattern is different from the shape of the sixth photo pattern, and the shape of the insulating one end portion and/or the insulating other end portion is different from the shape of the insulating intermediate portion, since the third portion coincides with the fourth portion, the insulating intermediate portion can be also continuous in the second direction. As a result, it is possible to form the insulating layer having the insulating one end portion and/or the insulating other end portion which can have a different shape from the insulating intermediate portion and having excellent reliability.

Further, since the one second photomask is sequentially moved in the first direction to expose the photosensitive precursor layer a plurality of times, it is possible to easily form the insulating layer described above, while the number of components of the production device is reduced.

The present invention (5) includes the method for producing a wiring circuit board described in any one of (1) to (4) further including a step of forming an alignment mark in a boundary portion of sheet areas adjacent to each other in the first direction.

In this method, it is possible to accurately form the conductive pattern and/or the insulating layer.

The present invention (6) includes the method for producing a wiring circuit board described in (6), wherein prior to the step of forming the conductive pattern, a step of forming the alignment mark is carried out and in the step of forming the alignment mark, the two alignment marks sandwiching the boundary of the sheet areas adjacent to each other in the first direction therebetween are formed at one time.

However, when the two alignment marks sandwiching the boundary of the sheet areas therebetween are separately formed, there may be a case where the other alignment mark deviates from one alignment mark in a direction perpendicular to the first direction. Then, there may be a case where even when the photomask is aligned using one alignment mark, and then, the photomask is moved to be again aligned using the other alignment mark, the first portion and the second portion do not easily coincide.

However, in this method, since the two alignment marks are formed at one time, it is possible to suppress the deviation of the two alignment marks in the direction perpendicular to the first direction. Therefore, the first portion and the second portion can further more reliably coincide.

The present invention (7) includes a wiring circuit board assembly sheet including a support sheet extending in a first direction, a plurality of wiring circuit boards provided in the support sheet and including a conductive pattern extending in a second direction inclined with respect to the first direction, and a plurality of sheet areas having the conductive pattern of the same shape and sequentially partitioned in the first direction, wherein in each of the plurality of sheet areas, the conductive pattern has a conductive one end portion, a conductive other end portion, and a conductive intermediate portion; the plurality of conductive intermediate portions are disposed adjacent to each other at spaced intervals in a third direction perpendicular to the second direction; the plurality of conductive intermediate portions include a fifth end edge located in a first directional one end edge of the sheet area and a sixth end edge located in a first directional other end edge of the sheet area; and the fifth end edge of one conductive intermediate portion in one sheet area coincides with the sixth end edge of the other conductive intermediate portion adjacent to one conductive intermediate portion in the third direction in the other sheet area adjacent to one sheet area in the first direction.

In the wiring circuit board assembly sheet, since the conductive intermediate portion of the conductive pattern includes the fifth end edge and the sixth end edge, and the fifth end edge of one conductive intermediate portion coincides with the sixth end edge of the other conductive intermediate portion, the conductive intermediate portion can be reliably continuous over the plurality of sheet areas. Therefore, the conductive pattern has excellent reliability.

The present invention (8) includes the wiring circuit board assembly sheet described in (7), wherein an alignment mark is provided in a boundary portion of the sheet areas adjacent to each other in the first direction.

Since the wiring circuit board assembly sheet includes the alignment mark, the plurality of wiring circuit boards have excellent reliability.

Effect of the Invention

According to the method for producing a wiring circuit board of the present invention, it is possible to easily form the conductive pattern described above, while the number of components of the production device is reduced.

In the wiring circuit board assembly sheet of the present invention, the conductive pattern has excellent reliability.

BRIEF DESCRIPTION OF THE DRAWINGS

FIG. 2A illustrating a second step of forming an alignment mark in a support sheet, FIG. 2B illustrating a third step of forming a base insulating layer, FIG. 2C illustrating a fourth step of forming a conductive pattern, and FIG. 2D illustrating a fifth step of forming a cover insulating layer.

FIGS. 3A to 3B show plan views for illustrating a process in a method for producing the wiring circuit board assembly sheet shown in FIG. 1:

FIG. 3A illustrating a second step of forming an alignment mark in a support sheet and FIG. 3B illustrating a third step of forming a base insulating layer.

FIGS. 4C to 4D, subsequent to FIG. 3B, show plan views for illustrating a process in a method for producing the wiring circuit board assembly sheet shown in FIG. 1:

FIG. 4C illustrating a fourth step of forming a conductive pattern and

FIG. 4D illustrating a fifth step of forming a cover insulating layer.

FIG. 5A illustrating a step of disposing an alignment photomask in a photosensitive precursor layer and FIG. 5B illustrating a step of sliding the alignment photomask with respect to the photosensitive precursor layer.

FIG. 6A illustrating a step of disposing a base photomask in a photosensitive base precursor layer and FIG. 6B illustrating a step of sliding the base photomask with respect to the photosensitive base precursor layer.

FIGS. 7A to 7F show cross-sectional views for illustrating a process explaining the third step shown in FIG. 2B and corresponding to a Y-Y line of FIG. 1:

FIG. 7A illustrating a step of disposing a photosensitive base precursor layer in a support sheet, FIG. 7B illustrating a step of disposing a base photomask in the photosensitive base precursor layer corresponding to a first sheet area to be exposed, FIG. 7C illustrating a step of moving the base photomask to the photosensitive base precursor layer corresponding to a second sheet area to be exposed, FIG. 7D illustrating a step of moving the base photomask to the photosensitive base precursor layer corresponding to a third sheet area to be exposed, FIG. 7E illustrating a step of moving a second photomask to the photosensitive base precursor layer corresponding to a fourth sheet area to be exposed, and FIG. 7F illustrating a step of developing the photosensitive base precursor layer to form a base insulating layer.

FIGS. 8A to 8B show plan views for illustrating a process explaining the fourth step shown in FIG. 4C:

FIG. 8A illustrating a step of disposing a photomask in a dry film resist and

FIG. 8B illustrating a step of sliding the photomask with respect to the dry film resist.

FIGS. 9A to 9F show cross-sectional views for illustrating a process explaining the fourth step shown in FIG. 2C and corresponding to the Y-Y line of FIG. 1:

FIG. 9A illustrating a step of forming a seed film in a support sheet and a base insulating layer, FIG. 9B illustrating a step of disposing a dry film resist in the seed film, FIG. 9C illustrating a step of disposing a photomask in the dry film resist corresponding to a first sheet area to be exposed, FIG. 9D illustrating a step of moving the photomask to the dry film resist corresponding to a second sheet area to be exposed, FIG. 9E illustrating a step of moving the photomask to the dry film resist corresponding to a third sheet area to be exposed, and FIG. 9F illustrating a step of moving a second photomask to the dry film resist corresponding to a fourth sheet area to be exposed.

FIG. 10G illustrating a step of developing the dry film resist to form a plating resist, FIG. 10H illustrating a step of forming a conductive pattern by plating, and FIG. 10I illustrating a step of removing the plating resist and the seed film.

FIGS. 11A to 11B show plan views for illustrating a process explaining the fifth step shown in FIG. 4D:

FIG. 11A illustrating a step of disposing a cover photomask in a photosensitive cover precursor layer and FIG. 11B illustrating a step of sliding the cover photomask with respect to the photosensitive cover precursor layer.

FIGS. 12A to 12F show cross-sectional views for illustrating a process explaining the fifth step shown in FIG. 2D and corresponding to the Y-Y line of FIG. 1:

FIG. 12A illustrating a step of disposing a photosensitive cover precursor layer in a base insulating layer and a conductive pattern, FIG. 12B illustrating a step of disposing a cover photomask in the photosensitive cover precursor layer corresponding to a first sheet area, FIG. 12C illustrating a step of moving the cover photomask to the photosensitive cover precursor layer corresponding to a second sheet area to be exposed, FIG. 12D illustrating a step of moving the cover photomask to the photosensitive cover precursor layer corresponding to a third sheet area to be exposed, FIG. 12E illustrating a step of moving a second photomask to the photosensitive cover precursor layer corresponding to a fourth sheet area to be exposed, and FIG. 12F illustrating a step of developing the photosensitive cover precursor layer to form a cover insulating layer.

FIGS. 13A to 13B show plan views for illustrating a modified example of the fourth step of FIGS. 8A to 8B:

FIG. 13A illustrating a step of disposing a photomask including a straight pattern in a dry film resist and FIG. 13B illustrating a plan view of a wiring circuit board assembly sheet including a conductive pattern having a conductive intermediate portion including a straight portion.

FIG. 14A illustrating a step of disposing a photomask in which a first end portion of a first photoline pattern is a straight portion in a dry film resist and FIG. 14B illustrating a plan view of a wiring circuit board assembly sheet including a conductive pattern having a conductive intermediate portion having an intersection.

FIGS. 18A to 18B show a modified example of the wiring circuit board assembly sheet shown in FIG. 1 and a modified example in which a width of a wire gradually becomes thicker toward one side in a second direction and an interval between the wires adjacent to each other gradually becomes wider toward one side in the second direction:

FIG. 18A illustrating a step of disposing a photomask including a photoline pattern of a changing shape in a dry film resist and FIG. 18B illustrating a plan view of the wiring circuit board assembly sheet including a conductive pattern having a conductive intermediate portion of a changing shape.

FIGS. 19A to 19B show a modified example of the wiring circuit board assembly sheet shown in FIG. 1 and a modified example in which a conductive intermediate portion has a generally S-shape:

FIG. 19A illustrating a step of disposing a photomask including a photoline pattern of a generally S-shape in a dry film resist and FIG. 19B illustrating a plan view of the wiring circuit board assembly sheet including a conductive pattern having a conductive intermediate portion of a generally S-shape.

FIG. 20A illustrating a step of disposing an alignment photomask in a photosensitive precursor layer corresponding to one sheet area, FIG. 20B illustrating a step of sliding the alignment photomask with respect to the photosensitive precursor layer corresponding to another sheet area, FIG. 20C illustrating a step of disposing a photomask in a dry film resist, FIG. 20D illustrating a step of sliding the photomask with respect to the dry film resist, and FIG. 20E illustrating a plan view of a conductive pattern with a partially enlarged view as a left-side view.

FIG. 21A illustrating a step of disposing an alignment photomask in a photosensitive precursor layer across the two sheet areas adjacent to each other, FIG. 21B illustrating a step of sliding the alignment photomask with respect to the photosensitive precursor layer, FIG. 21C illustrating a step of disposing a photomask in a dry film resist, FIG. 21D illustrating a step of sliding the photomask with respect to the dry film resist, and FIG. 21E illustrating a plan view of a conductive pattern with a partially enlarged view as a left-side view.

FIG. 22A illustrating a step of positioning a photomask using an alignment mark and FIG. 22B illustrating a plan view of a wiring circuit board assembly sheet including one alignment mark in each of boundary portions of both end portions in a width direction.

EMBODIMENT OF THE INVENTION

Figure 1:
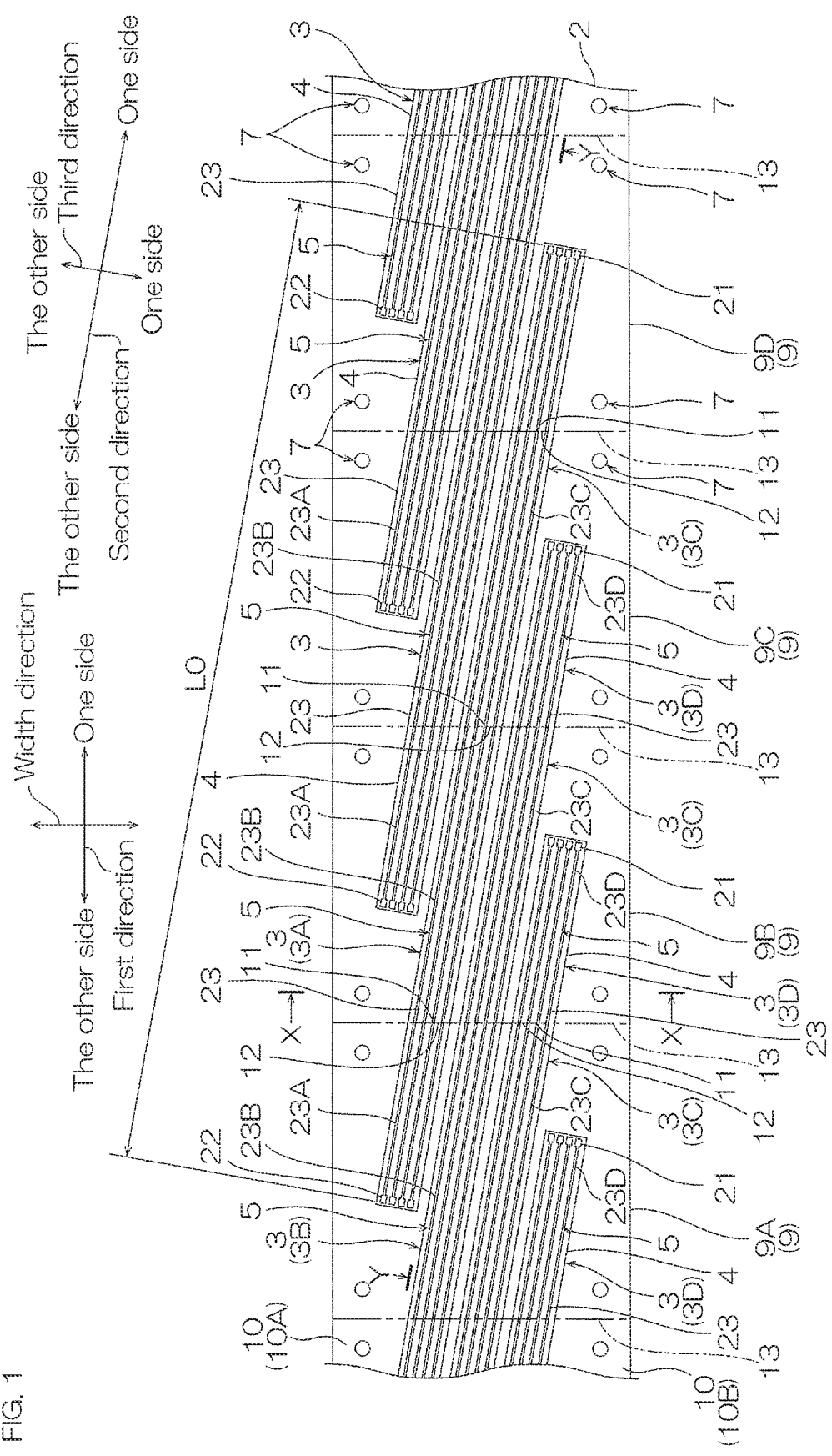
FIG. 1 shows a plan view of one embodiment of a wiring circuit board assembly sheet of the present invention.

One embodiment of a wiring circuit board assembly sheet and a method for producing a wiring circuit board of the present invention is described with reference to FIGS. 1 to 12. In FIG. 1, in order to clearly show the shape of a conductive pattern 5 (described later), a cover insulating layer 6 (described later) is omitted.

Figure 2A:
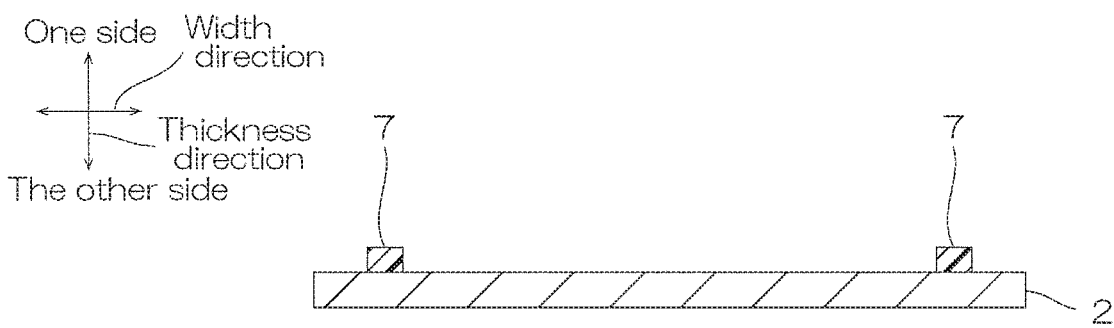
FIGS. 2A to 2D show cross-sectional views for illustrating a process along an X-X line in a method for producing the wiring circuit board assembly sheet shown in FIG. 1.
Figure 2B:
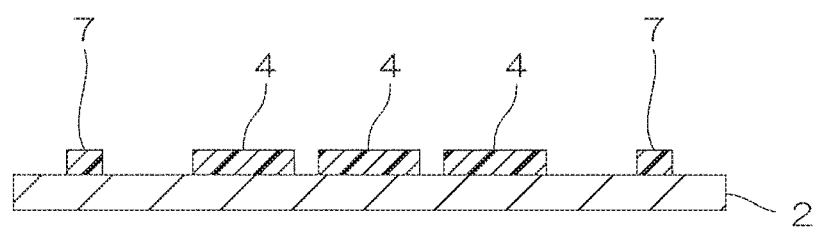
Figure 2C:
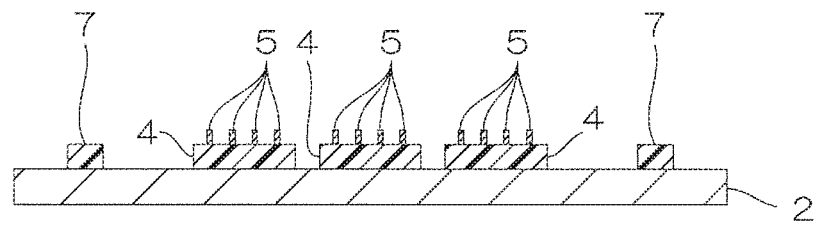
Figure 2D:
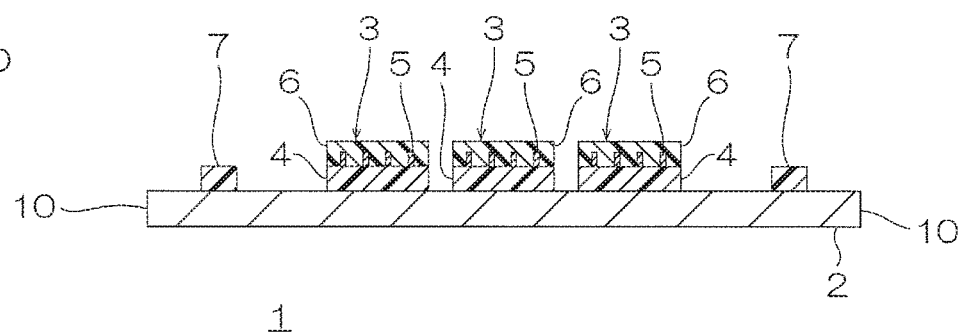

As shown in FIGS. 1 and 2D, a wiring circuit board assembly sheet 1 has a predetermined thickness, and is an elongated generally rectangular sheet when viewed from the top extending along a first direction perpendicular to a thickness direction. The wiring circuit board assembly sheet 1 may be wound so that both end edges in the first direction thereof (not shown) are close to each other. Further, the wiring circuit board assembly sheet 1 has width directional both end edges 10 facing each other in a width direction perpendicular to the thickness direction and the first direction. The wiring circuit board assembly sheet 1 includes one support sheet 2, a plurality of wiring circuit boards 3, and a plurality of alignment marks 7.

The support sheet 2 has the same shape as the wiring circuit board assembly sheet 1 when viewed from the top. The support sheet 2 is not particularly limited as long as it can support (secure) the plurality of wiring circuit boards 3 from the other side in the thickness direction. An example of the support sheet 2 includes a sheet having toughness, flexibility, and rigidity. Examples of the support sheet 2 include a metal plate such as stainless steel plate, a resin sheet such as polyimide sheet, and paper. Further, the support sheet 2 is a single layer or a multilayer (laminate). A thickness of the support sheet 2 is not particularly limited, and is, for example, 5 μm or more, preferably 15 μm or more, and for example, 500 μm or less, preferably 200 μm or less.

The plurality of wiring circuit boards 3 are disposed on one surface in the thickness direction of the support sheet 2. The plurality of wiring circuit boards 3 are arranged in alignment at spaced intervals in the first direction. Each of the plurality of wiring circuit boards 3 has a generally rectangular shape when viewed from the top that is long in a second direction inclined with respect to the first direction. An inclination angle of a second line (not shown) along the second direction with respect to a first line (not shown) along the first direction is, for example, 45 degrees or less, preferably, 30 degrees or less, more preferably, 20 degrees or less, further more preferably, 5 degrees or less, and for example, above 0 degree.

All of the plurality of wiring circuit boards 3 are overlapped when projected in the first direction.

The two wiring circuit boards 3 adjacent to each other in the first direction are disposed adjacent to each other at spaced intervals in a third direction. Specifically, the two wiring circuit boards 3 adjacent to each other in the first direction are partially overlapped when projected in the third direction. Specifically, when projected in the third direction, the other end portion and an intermediate portion in the second direction of one wiring circuit board 3 are overlapped with the other wiring circuit board 3 adjacent to one side in the third direction of one wiring circuit board 3, and one end portion in the second direction of one wiring circuit board 3 is not overlapped with (deviates from) the other wiring circuit board 3.

Each of the plurality of wiring circuit boards 3 includes the conductive pattern 5. The conductive pattern 5 is disposed over the second direction in the wiring circuit board 3. The conductive pattern 5 extends in the second direction. As shown in FIGS. 1 and 4C, the conductive pattern 5 includes a conductive one end portion 21, a conductive other end portion 22, and a conductive intermediate portion 23 in each of the plurality of wiring circuit boards 3.

The conductive one end portion 21 is located in one end portion in the second direction of the conductive pattern 5. The conductive one end portion 21 includes, for example, a one-side terminal. The plurality of one-side terminals are disposed adjacent to each other at spaced intervals in the third direction in the wiring circuit board 3. Each of the plurality of one-side terminals has, for example, a generally rectangular land shape.

The conductive other end portion 22 is located in the other end portion in the second direction of the conductive pattern 5. The conductive other end portion 22 includes, for example, an other-side terminal. The plurality of other-side terminals are disposed adjacent to each other at spaced intervals in the third direction in the wiring circuit board 3. Each of the plurality of other-side terminals has, for example, a generally rectangular land shape.

The conductive intermediate portion 23 is located in the intermediate portion in the second direction of the conductive pattern 5. The conductive intermediate portion 23 is located between the conductive one end portion 21 and the conductive intermediate portion 23. The conductive intermediate portion 23 extends in the second direction. The conductive intermediate portion 23 includes a narrower wire than the one-side terminal and the other-side terminal. The wire is continuous to the one-side terminal and the other-side terminal. Thus, the wire connects the one-side terminal to the other-side terminal in the second direction. The plurality of wires are disposed adjacent to each other at spaced intervals in the third direction in the wiring circuit board 3. The plurality of wires are parallel with each other. Each of the plurality of wires has a generally linear shape when viewed from the top along the second direction.

A length L0 in the second direction of the conductive pattern 5 is, for example, 300 mm or more, preferably 600 mm or more, more preferably 1,000 mm or more, and for example, 10,000 mm or less. The length L0 in the second direction of the conductive pattern 5 is a distance between one end edge of the conductive one end portion 21 and the other end edge of the conductive other end portion 22. When the length L0 in the second direction of the conductive pattern 5 is the above-described lower limit or more, it is suitable as an elongated wiring circuit board in which a transmission distance of electric signals or power supply currents is long.

A width of the wire in the conductive pattern 5 is, for example, 100 μm or less, preferably 90 μm or less, more preferably 80 μm or less, and for example, 5 μm or more. An interval between the wires adjacent to each other is, for example, 100 μm or less, preferably 90 μm or less, more preferably 80 μm or less, and for example, 5 μm or more. When the width and/or the interval are/is the above-described upper limit or less, it is suitable as the narrow wiring circuit board 3.

As shown in FIG. 2D, the wiring circuit board 3 further includes the cover insulating layer 6 as one example of an insulating layer adjacent to each of one side and the other side in the thickness direction of the conductive pattern 5, and a base insulating layer 4 as one example of an insulating layer. Specifically, the wiring circuit board 3 includes the base insulating layer 4, the conductive pattern 5 described above disposed on one surface in the thickness direction of the base insulating layer 4, and the cover insulating layer 6 disposed on one surface in the thickness direction of the base insulating layer 4 so as to expose the one-side terminal and the other-side terminal of the conductive pattern 5 and cover one surface in the thickness direction and both side surfaces in the third direction of the wire of the conductive pattern 5.

The base insulating layer 4 is disposed on one surface in the thickness direction of the support sheet 2. The base insulating layer 4 has the same outer shape as the wiring circuit board 3. As shown in FIGS. 3B to 4C, the base insulating layer 4 integrally includes a base one end portion 17 as one example of an insulating one end portion including the conductive one end portion 21 when viewed from the top, a base other end portion 18 as one example of an insulating other end portion including the conductive other end portion 22 when viewed from the top, and a base intermediate portion 19 as one example of an insulating intermediate portion including the conductive intermediate portion 23 when viewed from the top. An example of a material for the base insulating layer 4 includes a resin having insulating properties such as polyimide. A thickness of the base insulating layer 4 is, for example, 3 µm or more and 50 µm or less.

An example of a material fir the conductive pattern 5 includes a conductor such as copper. A thickness of the conductive pattern 5 is, for example, 5 µm or more and 100 µm or less.

As shown in FIGS. 3B and 4D, the cover insulating layer 6 includes a cover one end portion 25 as one example of an insulating one end portion included in the base one end portion 17 when viewed from the top, a cover other end portion 26 as one example of an insulating other end portion included in the base other end portion 18 when viewed from the top, and a cover intermediate portion 27 as one example of an insulating intermediate portion included in the base intermediate portion 19 when viewed from the top. An example of a material for the cover insulating layer 6 includes a resin having insulating properties such as polyimide. A thickness of the cover insulating layer 6 is, for example, 3 µm or more and 50 µm or less.

As shown in FIG. 2D, the alignment mark 7 is disposed on one surface in the thickness direction of the support sheet 2. Further as shown in FIGS. 1 and 3A, the plurality of alignment marks 7 are disposed in the vicinity of each of the width directional both end edges 10.

Of the width directional both end edges 10, the alignment mark 7 in the vicinity of a width directional one end edge 10A has a mark set 8 including a first mark 14 and a second mark 15 which is closely disposed with the first mark 14 in the first direction. The plurality of mark sets 8 are disposed at spaced intervals in the first direction.

Of the width directional both end edges 10, the alignment mark 7 in the vicinity of a width directional other end edge 10B also has the mark set 8 including the first mark 14 and the second mark 15 which is closely disposed with the first mark 14 in the first direction. The plurality of mark sets 8 are disposed at spaced intervals in the first direction.

More specifically, in the one mark set 8, the second mark 15 is oppositely disposed at a subtle interval to the first mark 14. A distance L1 between the first mark 14 and the second mark 15 in the one mark set 8 is, for example, 20 mm or less, preferably 10 mm or less, more preferably 5 mm or less, and for example, 0.5 mm or more.

The plurality of alignment marks 7 are disposed to be shifted toward both outer sides in the width direction of the plurality of wiring circuit boards 3 when projected in the first direction.

Further, one mark set 8 and the other mark set 8 adjacent thereto in the first direction are remoted. Specifically, a distance L2 between the second mark 15 of one mark set 8 and the first mark 14 of the other mark set 8 is longer than the distance L1 described above, and specifically, for example, 200 mm or more, preferably, 230 mm or more, more preferably, 280 mm or more, and for example, 600 mm or less. A ratio (L2/L1) of the distance L2 to the distance L1 is, for example, 10 or more, preferably, 25 or more, more preferably, 50 or more, and for example, 1200 or less.

A material for the alignment mark 7 is not particularly limited. Examples thereof include a resin and a conductor. Preferably, the same resin as the base insulating layer 4 is used.

As shown in FIG. 3A, in the wiring circuit board assembly sheet 1, the one mark set 8 defines a boundary 13 of sheet areas 9 adjacent to each other in the first direction. The boundary 13 is along the width direction over the width directional both end edges 10. Specifically, the boundary 13 is a line segment passing through the intermediate point of the line segment connecting the center of gravity of the first mark 14 to the center of gravity of the second mark 15 and parallel in the width direction. The boundary 13 is shown by a phantom line in FIG. 1 and FIGS. 3A to 4D, and in the actual wiring circuit board assembly sheet 1, the outer shape of the boundary 13 may not be clearly visually recognized.

Further, a peripheral region including the boundary 13 is referred to as a boundary portion 16. The mark set 8 is located in the boundary portion 16.

Then, by the two boundaries 13 spaced apart from each other in the first direction, the one sheet area 9 is partitioned. Further, the three or more boundaries 13 divide the plurality of sheet areas 9. The plurality of sheet areas 9 are sequentially partitioned in the first direction.

Each of the plurality of sheet areas 9 has the width directional both end edges 10, a first end edge 11 as one example of a fifth end edge connecting a first directional one end edge of the width directional both end edges 10, and a second end edge 12 as one example of a sixth end edge connecting a first directional other end edge of the width directional both end edges 10.

The width directional both end edges 10 included in the plurality of sheet areas 9 are the same as the width directional both end edges 10 of the wiring circuit board assembly sheet 1.

The second end edge 12 of one sheet area 9 is the same as the first end edge 11 of the other sheet area 9 adjacent to the other side in the first direction of one sheet area 9.

Then, as shown in FIGS. 1 and 4C, in the wiring circuit board assembly sheet 1, one wiring circuit board 3 is disposed over the continuous plurality of (four) sheet areas 9. The plurality of sheet areas 9 have the conductive pattern 5 of the same shape.

For example, the four sheet areas 9 described above are sequentially referred to as a first sheet area 9A, a second sheet area 9B, a third sheet area 9C, and a fourth sheet area 9D toward one side in the first direction. In this case, the conductive one end portion 21 in one conductive pattern 5 is disposed in the fourth sheet area 9D. On the other hand, the conductive other end portion 22 in one conductive pattern 5 described above is disposed in the first sheet area 9A. On the other hand, the conductive intermediate portion 23 in one conductive pattern 5 is disposed over the first sheet area 9A to the fourth sheet area 9D.

On the other hand, in the one sheet area 9, the four conductive intermediate portions 23 adjacent to each other in the third direction are disposed. In the one sheet area 9 (specifically, each of the first sheet area 9A to the fourth sheet area 9D), a first conductive intermediate portion 23A, a second conductive intermediate portion 23B, a third conductive intermediate portion 23C, and a fourth conductive intermediate portion 23D are independently disposed. The first conductive intermediate portion 23A, the second conductive intermediate portion 23B, the third conductive intermediate portion 23C, and the fourth conductive intermediate portion 23D are sequentially disposed at spaced intervals toward one side in the third direction in the one sheet area 9.

Further, the first conductive intermediate portion 23A disposed in the one sheet area 9 is continuous to the conductive other end portion 22. The fourth conductive intermediate portion 23D disposed in the one sheet area 9 is continuous to the conductive one end portion 21.

Then, the first end edge 11 of the first conductive intermediate portion 23A in the first sheet area 9A coincides with the second end edge 12 of the second conductive intermediate portion 23B in the second sheet area 9B. Thus, the first conductive intermediate portion 23A of the first sheet area 9A is continuous to the second conductive intermediate portion 23B of the second sheet area 9B in the second direction.

Further, the first end edge 11 of the second conductive intermediate portion 23B in the second sheet area 9B coincides with the second end edge 12 of the third conductive intermediate portion 23C in the third sheet area 9C. Thus, the second conductive intermediate portion 23B of the second sheet area 9B is continuous to the third conductive intermediate portion 23C of the third sheet area 9C in the second direction.

Furthermore, the first end edge 11 of the third conductive intermediate portion 23C in the third sheet area 9C coincides with the second end edge 12 of the fourth conductive intermediate portion 23D in the fourth sheet area 9D. Thus, the third conductive intermediate portion 23C of the third sheet area 9C is continuous to the fourth conductive intermediate portion 23D of the fourth sheet area 9D in the second direction.

Accordingly, the first conductive intermediate portion 23A of the first sheet area 9A, the second conductive intermediate portion 23B of the second sheet area 9B, the third conductive intermediate portion 23C of the third sheet area 9C, and the fourth conducive intermediate portion 23D of the fourth sheet area 9D are continuous in the second direction over the first sheet area 9A to the fourth sheet area 9D. Thus, the conductive intermediate portion 23 in the one wiring circuit board 3 is continuously disposed in the second direction over the continuous four sheet areas 9.

As shown in FIG. 3B, the base intermediate portion 19 is also continuously disposed in the second direction over the continuous plurality of (four) sheet areas 9 in the plurality of (four) sheet areas 9 that are continuous in the second direction in the same manner as the conductive intermediate portion 23. The plurality of sheet areas 9 have the base insulating layer 4 of the same shape. The base intermediate portion 19 includes a first base intermediate portion 19A, a second base intermediate portion 19B, a third base intermediate portion 19C, and a fourth base intermediate portion 19D each of which includes the first conductive intermediate portion 23A, the second conductive intermediate portion 23B, the third conductive intermediate portion 23C, and the fourth conductive intermediate portion 23D (ref: FIG. 4C), respectively.

Further, as shown in FIG. 4D, the cover intermediate portion 27 is continuously disposed in the second direction over the continuous plurality of (four) sheet areas 9 in the plurality of (four) sheet areas 9 that are continuous in the second direction in the same manner as the conductive intermediate portion 23. The plurality of sheet areas 9 have the cover insulating layer 6 of the same shape. The cover intermediate portion 27 includes a first cover intermediate portion 27A, a second cover intermediate portion 27B, a third cover intermediate portion 27C, and a fourth cover intermediate portion 27D each of which is included in the first base intermediate portion 19A, the second base intermediate portion 19B, the third base intermediate portion 19C, and the fourth base intermediate portion 19D (ref: FIG. 4C), respectively.

Next, a method for producing the wiring circuit board assembly sheet 1 is described.

As shown in FIGS. 2A to 2D, the method includes a first step of preparing the support sheet 2, a second step (ref: FIG. 2A) of forming the alignment mark 7, a third step (ref: FIG. 2B) of forming the base insulating layer 4, a fourth step (ref: FIG. 2C) of forming the conductive pattern 5, and a fifth step (ref: FIG. 2D) of forming the cover insulating layer 6. Further, the method for producing the wiring circuit board assembly sheet 1 is carried out by a roll-to-roll method.

[First Step]

In the first step, as shown in FIGS. 2A and 3A, the elongated support sheet 2 in the first direction is prepared.

[Second Step]

Subsequently, in the second step, the alignment mark 7 is formed on one surface in the thickness direction of the support sheet 2.

The method of forming the alignment mark 7 is not particularly limited. The alignment mark 7 is, for example, firmed by a photolithography method. Specifically, as shown in FIG. 5A, a photosensitive precursor layer 24 is disposed on the entire one surface in the thickness direction of the support sheet 2, and subsequently, a photosensitive resin is exposed through an alignment photomask 20 to be then developed.

Figure 5A:
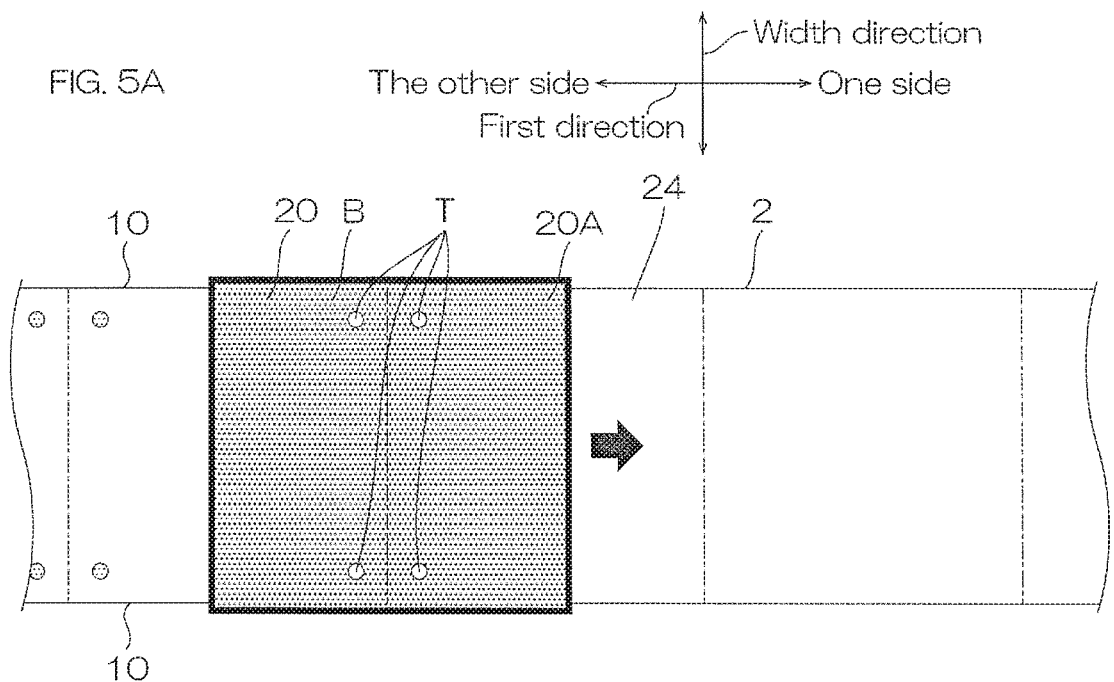
FIGS. 5A to 5B show views for illustrating the second step shown in FIG. 3A.
Figure 5B:
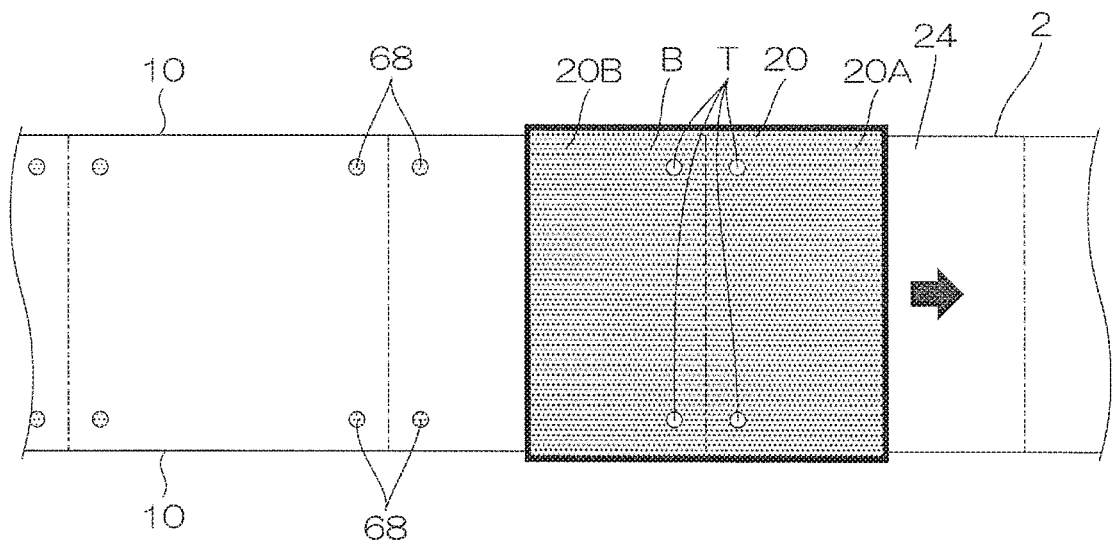

Specifically, as shown in FIGS. 5A to 5B, the one alignment photomask 20 is sequentially moved in the first direction to expose the photosensitive precursor layer 24 a plurality of times.

The alignment photomask 20 has a pattern corresponding to the mark set 8. The mark set 8 is the one mark set 8 in the vicinity of one end edge in the width directional both end edges 10, and the mark set 8 facing it in the width direction. The alignment photomask 20 has, for example, a generally rectangular outer shape when viewed from the top. For example, when the photosensitive precursor layer 24 is a negative type, the pattern of the alignment photomask 20 has a light transmitting pattern T corresponding to the mark set 8 and a light shielding pattern B corresponding to a portion other than the mark set 8.

First, as shown in FIG. 5A, the one alignment photomask 20 is disposed on one side in the thickness direction of the photosensitive precursor layer 24 corresponding to one mark set 8. Subsequently, only the photosensitive precursor layer 24 corresponding to the alignment photomask 20 is exposed through the alignment photomask 20 to form a latent image 68 (ref: FIG. 5B) corresponding to one mark set 8 in the photosensitive precursor layer 24.

As shown by an arrow of FIG. 5A and FIG. 5B, the alignment photomask 20 is subsequently moved (slid) to one side in the first direction with respect to the photosensitive precursor layer 24, and is disposed on one side in the thickness direction of the photosensitive precursor layer 24 corresponding to the mark set 8 adjacent to one side in the first direction of one mark set 8. At this time, for example, in the photosensitive precursor layer 24, a portion 20A facing one end portion in the first direction in the alignment photomask 20 at the time of the previous exposure is overlapped with a portion 20B facing the other end portion in the first direction in the alignment photomask 20 at the time of the present exposure.

Subsequently, the photosensitive precursor layer 24 is exposed through the alignment photomask 20 after movement to form another latent image 68. The movement of the alignment photomask 20, the exposure of the photosensitive precursor layer 24, and the formation of the latent image 68 described above are repeated.

Thereafter, the photosensitive precursor layer 24 is developed and if necessary heated.

Thus, as shown in FIG. 3A, the plurality of alignment marks 7 are formed on one surface in the thickness direction of the support sheet 2.

[Third Step]

Then, in the third step, as shown in FIG. 2B, the base insulating layer 4 is formed.

A method of forming the base insulating layer 4 is not particularly limited. The base insulating layer 4 is, for example, formed by a photolithography method. For example, as shown in FIGS. 6A to 7F, a photosensitive base precursor layer 81 as one example of a photosensitive precursor layer is disposed on one surface in the thickness direction of the support sheet 2, and then, the photosensitive base precursor layer 81 is exposed through a base photomask 31 as one example of a second photomask to be then developed.

In order to dispose the photosensitive base precursor layer 81 on one surface in the thickness direction of the support sheet 2, as shown in FIG. 7A, for example, a precursor composition of the above-described resin having photosensitivity is applied to one surface in the thickness direction of the support sheet 2 and if necessary, dried.

Subsequently, as shown in FIGS. 7B to 7E, the one base photomask 31 is prepared and sequentially moved in the first direction to expose the photosensitive base precursor layer 81 a plurality of times.

Figure 6A:
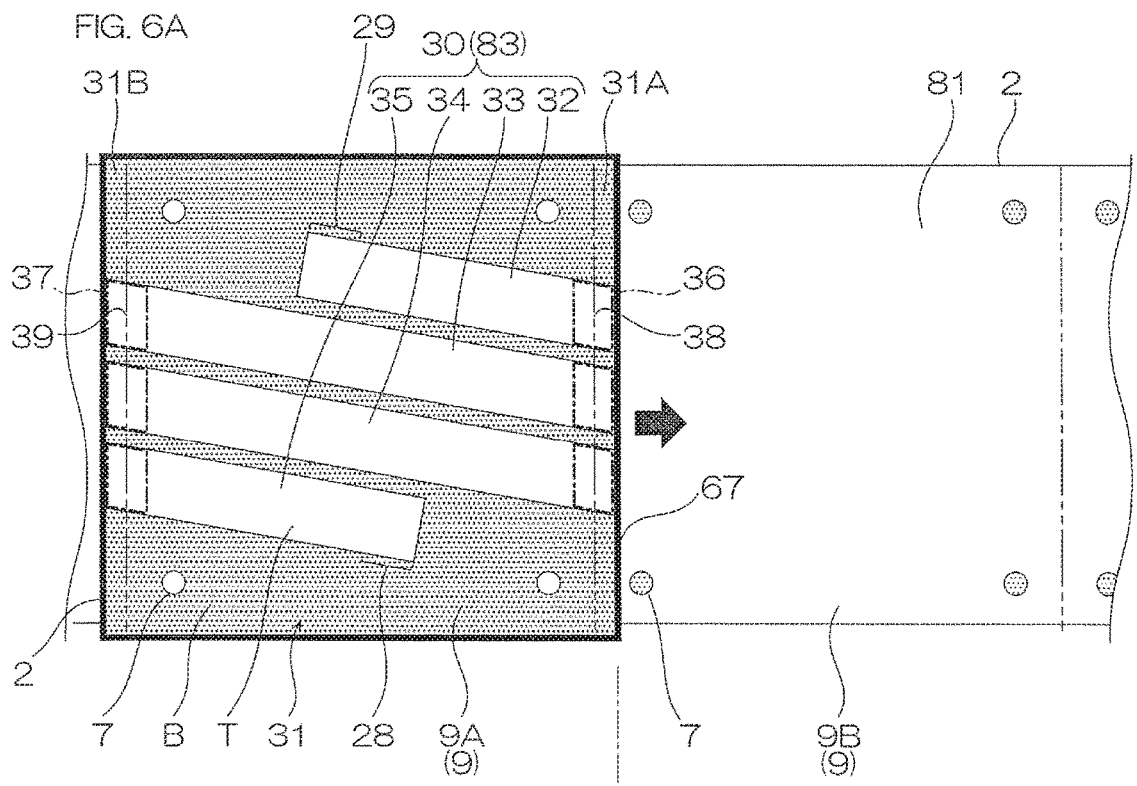
FIGS. 6A to 6B show plan views for illustrating a process explaining the third step shown in FIG. 3B.

As shown in FIG. 6A, the base photomask 31 includes a first base photo pattern 28 as one example of a fourth photo pattern, a second base photo pattern 29 as one example of a fifth photo pattern, and a third base photo pattern 30 as one example of a sixth photo pattern.

Each of the first base photo pattern 28, the second base photo pattern 29, and the third base photo pattern 30 in the one base photomask 31 corresponds to each of the base one end portion 17, the base other end portion 18, and the base intermediate portion 19 in one sheet area 9 (ref: FIG. 3B), respectively. In the base photomask 31, for example, when the photosensitive base precursor layer 81 is a negative type, it has the light transmitting pattern T corresponding to the base insulating layer 4 and the light shielding pattern B corresponding to a portion other than the base insulating layer 4.

The third base photo pattern 30 includes a base photo pattern 83 as one example of a plurality of photo patterns disposed adjacent to each other at spaced intervals in the third direction in the one base photomask 31. The plurality of base photo patterns 83 sequentially have a fourth base photo pattern 32, a fifth base photo pattern 33, a sixth base photo pattern 34, and a seventh base photo pattern 35 toward one side in the third direction.

Each of the fourth base photo pattern 32 to the seventh base photo pattern 35 corresponds to each of the first base intermediate portion 19A to the fourth base intermediate portion 19D (ref: FIG. 3B).

Further, the base photomask 31 has, for example, a mask frame 67 having a generally rectangular shape when viewed from the top. The base photomask 31 includes a base mask one end portion 31A as one example of a first directional one end portion, and a base mask other end portion 31B as one example of a first directional other end portion at the inside of the mask frame 67.

Then, in the plurality of base photo patterns 83, a slide pattern obtained by sliding (subjected to parallel movement of) a base photo pattern first end portion 36 that is a portion located in the base mask one end portion 31A of the fourth base photo pattern 32 to the other side in the first direction coincides with a base photo pattern second end portion 37 that is a portion located in the base mask other end portion 31B of the fifth base photo pattern 33.

The base photo pattern first end portion 36 includes a base first portion 38. The base first portion 38 is located in the intermediate portion in the first direction in the base photo pattern first end portion 36, and disposed over the entire width direction in the base photo pattern first end portion 36. Specifically, the base first portion 38 is located in the central portion in the first direction of the base photo pattern first end portion 36.

The base photo pattern second end portion 37 includes a base second portion 39. The base second portion 39 is located in the intermediate portion in the first direction in the base photo pattern second end portion 37, and disposed over the entire width direction in the base photo pattern second end portion 37. Specifically, the base second portion 39 is located in the central portion in the first direction of the base photo pattern second end portion 37.

Then, the base first portion 38 coincides with the base second portion 39 when projected in the first direction. That is, the position in the width direction of the base first portion 38 is the same as the position in the width direction of the base second portion 39 when projected in the first direction.

Further, a slide pattern obtained by sliding (subjected to parallel movement of) the base photo pattern first end portion 36 located in the base mask one end portion 31A of the fifth base photo pattern 33 to the other side in the first direction coincides with the base photo pattern second end portion 37 located in the base mask other end portion 31B of the sixth base photo pattern 34. Each of the base photo pattern first end portion 36 of the fifth base photo pattern 33 and the base photo pattern second end portion 37 of the sixth base photo pattern 34 includes each of the base first portion 38 and the base second portion 39, respectively. The base first portion 38 of the fifth base photo pattern 33 coincides with the base second portion 39 of the sixth base photo pattern 34 when projected in the first direction.

Furthermore, a slide pattern obtained by sliding (subjected to parallel movement of) the base photo pattern first end portion 36 located in the base mask one end portion 31A of the sixth base photo pattern 34 to the other side in the first direction coincides with the base photo pattern second end portion 37 located in the base mask other end portion 31B of the seventh base photo pattern 35. Each of the base photo pattern first end portion 36 of the sixth base photo pattern 34 and the base photo pattern second end portion 37 of the seventh base photo pattern 35 includes each of the base first portion 38 and the base second portion 39, respectively. The base first portion 38 of the sixth base photo pattern 34 coincides with the base second portion 39 of the seventh base photo pattern 35 when projected in the first direction.

In other words, of the plurality of base photo patterns 83, a slide pattern obtained by sliding (subjected to parallel movement of) the base photo pattern first end portion 36 of one third base photo pattern 30 to one side in the first direction coincides with the base photo pattern second end portion 37 of the other third base photo pattern 30 adjacent to one side in the third direction of one third base photo pattern 30.

In the third step, the base photomask 31 is disposed on one side in the thickness direction of the photosensitive base precursor layer 81, while the base photomask 31 is aligned using the alignment mark 7.

First, the base photomask 31 is disposed with respect to the photosensitive base precursor layer 81 corresponding to one sheet area 9 with the first mark 14 and the second mark 15 in one sheet area 9 as a reference.

Figure 6B:
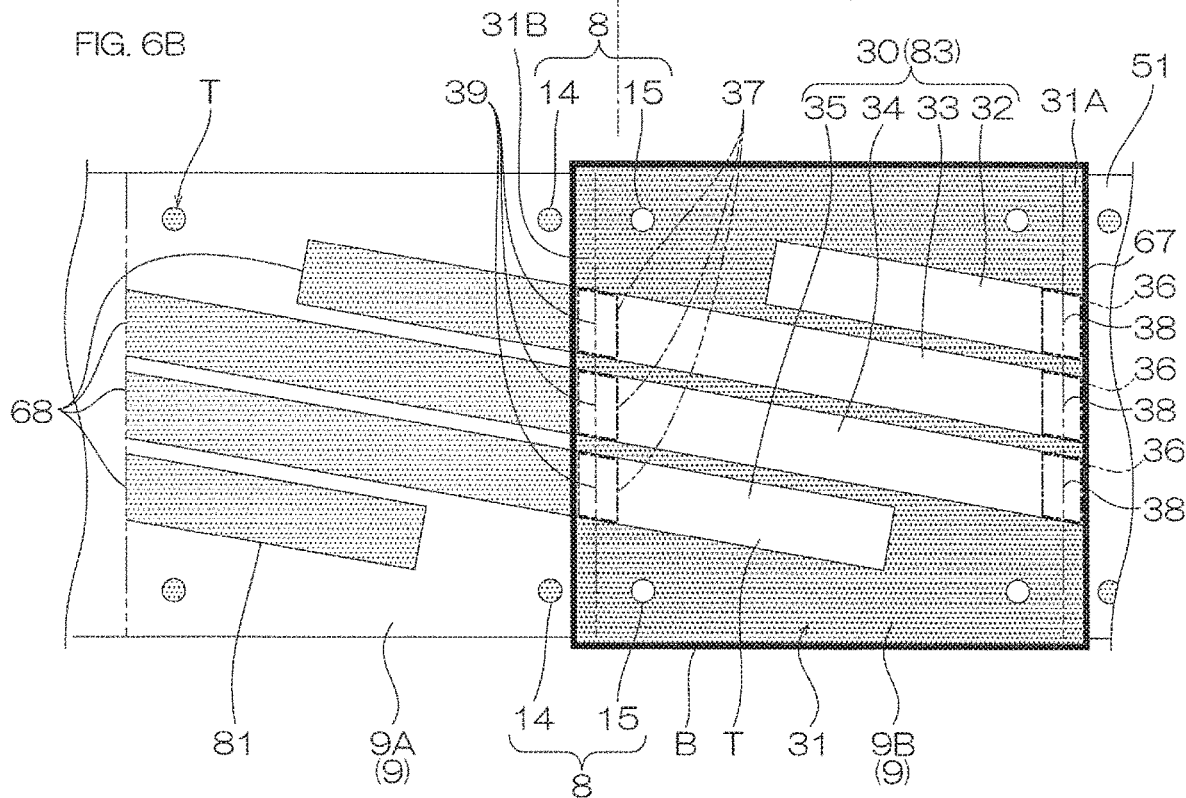

Subsequently, only the photosensitive base precursor layer 81 corresponding to the base photomask 31 is exposed through the base photomask 31 to form the latent image 68 (ref: FIG. 6B) corresponding to the first base photo pattern 28 to the third base photo pattern 30 in the photosensitive base precursor layer 81.

As shown by the arrow of FIG. 6A, FIG. 6B, the arrow of FIG. 7B, and FIG. 7C, the base photomask 31 is subsequently moved (slid) to one side in the first direction with respect to the photosensitive base precursor layer 81, and disposed on one side in the thickness direction of the photosensitive base precursor layer 81 corresponding to the other sheet area 9 (for example, the second sheet area 9B) adjacent to one side in the first direction of one sheet area 9 (for example, the first sheet area 9A).

When the base photomask 31 is moved and disposed with respect to the photosensitive base precursor layer 81, the base photomask 31 is disposed in the photosensitive base precursor layer 81 corresponding to the other sheet area 9 (for example, the second shed area 9B) with the first mark 14 and the second mark 15 in the other sheet area 9 (for example, the second sheet area 9B) as a reference.

Further, in the photosensitive base precursor layer 81, a portion facing the base mask one end portion 31A of the base photomask 31 at the time of the previous exposure is overlapped with a portion facing the base mask other end portion 31B of the base photomask 31 at the time of the present exposure.

Then, in the photosensitive base precursor layer 81, a portion corresponding to the base first portion 38 of the base photomask 31 at the time of the previous exposure coincides with a portion corresponding to the base second portion 39 of the base photomask 31 at the time of the present exposure.

Subsequently, the photosensitive base precursor layer 81 is exposed to form another latent image 68 through the base photomask 31 after movement.

Thereafter, as shown in FIGS. 7D to 7E, the movement of the base photomask 31, the alignment of the base photomask 31, the exposure of the photosensitive base precursor layer 81, and the formation of the latent image 68 described above are repeated.

Thereafter, as shown in FIG. 7F, the photosensitive base precursor layer 81 is developed and if necessary, heated.

Thus, as shown in FIGS. 3B and 7F, the base insulating layer 4 including the base intermediate portion 19 continuous in the second direction over the plurality of sheet areas 9 is formed.

[Fourth Step]

Then, as shown in FIG. 2C, in the fourth step, the conductive pattern 5 is formed. The conductive pattern 5 is formed on one surface in the thickness direction of the base insulating layer 4.

Figure 10G:
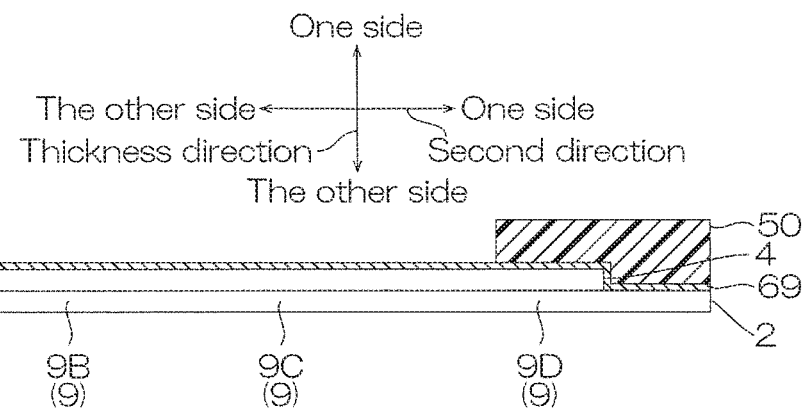
FIGS. 10G to 10I, subsequent to FIG. 9F, show cross-sectional views for illustrating a process explaining the fourth step shown in FIG. 2C and corresponding to the Y-Y line of FIG. 1.
Figure 10H:
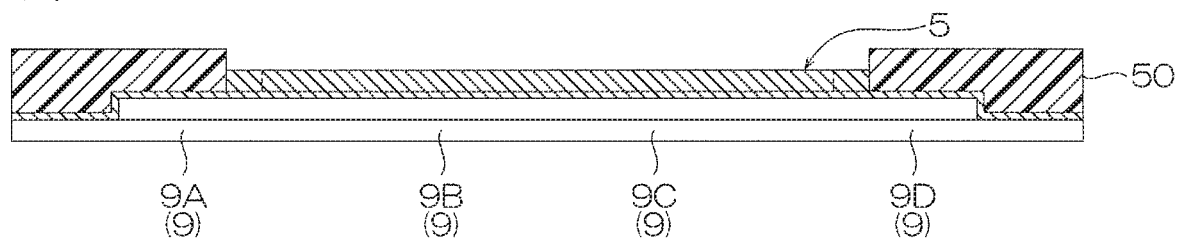

As shown in FIGS. 10G to 10H, the conductive pattern 5 is formed using a plating resist 50 as one example of a resist. As shown in FIGS. 9B to 10G, the plating resist 50 is formed by photolithography in which one photomask 40 is sequentially moved in the first direction (ref: FIGS. 11A to 11B) to be exposed a plurality of times with respect to a photosensitive dry film resist 60 as one example of a photoresist.

In the fourth step, first, as shown in FIG. 9A, a seed film 69 is disposed on one surfaces in the thickness direction of the base insulating layer 4, the alignment mark 7, and the support sheet 2. The seed film 69 is, for example, formed by sputtering. A material for the seed film 69 includes a conductor that is the same as the conductive pattern 5 (specifically, copper). A thickness of the seed film 69 is, for example, 10 nm or more, and for example, 1000 nm or less.

Then, in the fourth step, as shown in FIG. 9B, the photosensitive dry film resist 60 is laminated on one surface in the thickness direction of the seed film 69.

Then, in the fourth step, as shown in FIGS. 8A and 9C, the photomask 40 is disposed on one side in the thickness direction of the dry film resist 60.

The one photomask 40 has a first photo pattern 41, a second photo pattern 42, and a third photo pattern 43. Each of the first photo pattern 41 to the third photo pattern 43 corresponds to each of the conductive one end portion 21, the conductive other end portion 22, and the conductive intermediate portion 23 in one sheet area 9 (ref: FIG. 4C). In the photomask 40, for example, when the dry film resist 60 is a negative type, it has the light shielding pattern B corresponding to the conductive pattern 5, and the light transmitting pattern T corresponding to a portion other than the conductive pattern 5.

The third photo pattern 43 includes a plurality of photoline patterns 44 disposed adjacent to each other at spaced intervals in the third direction in the one photomask 40. The plurality of photoline patterns 44 sequentially include a first photoline pattern 46, a second photoline pattern 47, a third photoline pattern 48, and a fourth photoline pattern 49 toward one side in the third direction. Each of the first photoline pattern 46 to the fourth photoline pattern 49 corresponds to each of the first conductive intermediate portion 23A to the fourth conductive intermediate portion 23D, respectively (ref: FIG. 4C).

The photomask 40 includes, for example, the mask frame 67 having a generally rectangular shape when viewed from the top. The first photo pattern 41 to the third photo pattern 43 are provided in the mask frame 67 described above.

Further, the photomask 40 includes a first directional one end portion 61, and a first directional other end portion 62 at the inside of the mask frame 67. The first directional one end portion 61 and the first directional other end portion 62 are located in the vicinity of each of the inside of two sides 45 facing each other in the first direction in the frame of the photomask 40.

A slide pattern obtained by sliding (subjected to parallel movement of) a first photoline pattern first end portion 63 located in the first directional one end portion 61 of the first photoline pattern 46 in the photomask 40 to the other side in the first direction coincides with a first photoline pattern second end portion 64 located in the first directional other end portion 62 of the second photoline pattern 47.

The first photoline pattern first end portion 63 includes a first portion 65. The first portion 65 is located at least in the intermediate portion in the first direction in the first photoline pattern first end portion 63. Specifically, the first portion 65 is located in the central portion in the first direction of the first photoline pattern first end portion 63.

The first photoline pattern second end portion 64 includes a second portion 66. The second portion 66 is located at least in the intermediate portion in the first direction in the first photoline pattern second end portion 64. Specifically, the second portion 66 is located in the central portion in the first direction of the first photoline pattern second end portion 64.

Then, the first portion 65 coincides with the second portion 66 when projected in the first direction. That is, the position in the width direction of the first portion 65 is the same as the position in the width direction of the second portion 66 when projected in the first direction.

Further, a slide pattern obtained by sliding (subjected to parallel movement of) the first photoline pattern first end portion 63 located in the first directional one end portion 61 of the second photoline pattern 47 to the other side in the first direction coincides with the first photoline pattern second end portion 64 located in the first directional other end portion 62 of the third photoline pattern 48. Each of the first photoline pattern first end portion 63 of the second photoline pattern 47 and the first photoline pattern second end portion 64 of the third photoline pattern 48 includes each of the first portion 65 and the second portion 66, respectively. The first portion 65 of the second photoline pattern 47 coincides with the second portion 66 of the third photoline pattern 48 when projected in the first direction.

Furthermore, a slide pattern obtained by sliding (subjected to parallel movement of) the first photoline pattern first end portion 63 located in the first directional one end portion 61 of the third photoline pattern 48 to the other side in the first direction coincides with the first photoline pattern second end portion 64 located in the first directional other end portion 62 of the fourth photoline pattern 49. Each of the first photoline pattern first end portion 63 of the third photoline pattern 48 and the first photoline pattern second end portion 64 of the fourth photoline pattern 49 includes each of the first portion 65 and the second portion 66, respectively. The first portion 65 of the third photoline pattern 48 coincides with the second portion 66 of the fourth photoline pattern 49 when projected in the first direction.

In other words, of the plurality of photoline patterns 44, a slide pattern obtained by sliding (subjected to parallel movement of) the first photoline pattern first end portion 63 of one plurality of photoline patterns 44 to the other side in the first direction coincides with the first photoline pattern second end portion 64 of the other plurality of photoline patterns 44 adjacent to one side in the third direction of one plurality of photoline patterns 44.

In the fourth step, the photomask 40 is disposed on one side in the thickness direction of the dry film resist 60, while the photomask 40 is aligned using the alignment mark 7.

In the alignment of the photomask 40 using the alignment mark 7, the photomask 40 is disposed with respect to the dry film resist 60 corresponding to one sheet area 9 with the first mark 14 and second mark 15 in one sheet area 9 as a reference.

Subsequently, only the dry film resist 60 corresponding to the photomask 40 is exposed through the photomask 40 to form the latent image 68 corresponding to the first photo pattern 41 to the third photo pattern 43 in the dry film resist 60.

As shown by the arrow of FIG. 8A, FIG. 8B, the arrow of FIG. 9C, and FIG. 9D, the photomask 40 is subsequently moved (slid) to one side in the first direction with respect to the dry film resist 60, and disposed on one side in the thickness direction of the dry film resist 60 corresponding to the other sheet area 9 (for example, the second sheet area 9B) adjacent to one side in the first direction of one sheet area 9 (for example, the first sheet area 9A).

When the photomask 40 is moved and disposed with respect to the dry film resist 60, the photomask 40 is disposed in the dry film resist 60 corresponding to the other sheet area 9 (for example, the second sheet area 9B) with the first mark 14 and the second mark 15 in the other sheet area 9 (for example, the second sheet area 9B) as a reference.

Further, in the dry film resist 60, a portion facing the first directional one end portion 61 of the photomask 40 at the time of the previous exposure is overlapped with a portion facing the first directional other end portion 62 of the photomask 40 at the time of the present exposure. Thus, an overlapped portion is present in the dry film resist 60.

Then, in the dry film resist 60, a portion corresponding to the first portion 65 of the photomask 40 at the time of the previous exposure coincides with a portion corresponding to the second portion 66 of the photomask 40 at the time of the present exposure.

As shown in FIG. 8B, the line segment passing through the central portion in the first direction of the overlapped portion becomes the boundary 13.

Subsequently, the dry film resist 60 is exposed through the photomask 40 after movement to form another latent image 68.

As shown in FIGS. 9D to 9E, the movement of the photomask 40, the alignment of the photomask 40, the exposure of the dry film resist 60, and the formation of the latent image 68 described above are repeated.

In the fourth step, in the dry film resist 60, a portion facing the first directional one end portion 61 of the one photomask 40 at the time of the n-th time (a is a natural number) exposure is overlapped with a portion facing the first directional other end portion 62 of the one photomask 40 at the time of the [n+1]th time exposure. A plurality of overlapped portions are present.

Thus, the plurality of boundaries 13 are partitioned by the plurality of overlapped portions, thereby defining the plurality of sheet areas 9.

As shown in FIG. 10G, thereafter, the dry film resist 60 is developed and if necessary, heated to form the plating resist 50 in an inverted pattern of the conductive pattern 5.

As shown in FIG. 10H, thereafter, the conductive pattern 5 is formed using the plating resist 50 by plating.

Figure 10I:
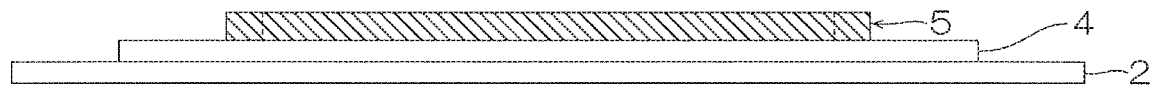

As shown in FIG. 10I, a clear boundary may be present, or as shown in FIG. 10H, the boundary may not be present between the conductive pattern 5 and the seed film 69 adjacent to the other side in the thickness direction thereof.

Subsequently, as shown in FIG. 10I, the plating resist 50 is removed, and subsequently, the seed film 69 exposed from the conductive pattern 5 is removed.

Thus, as shown in FIGS. 2C and 4C, the conductive pattern 5 including the conductive intermediate portion 23 continuous in the second direction over the plurality of sheet areas 9 is formed.

[Fifth Step]

Thereafter, as shown in FIG. 2D, in the fifth step, the cover insulating layer 6 is formed. The cover insulating layer 6 is disposed on one surface in the thickness direction of the base insulating layer 4 so as to cover the wire of the conductive pattern 5 and expose the one-side terminal and the other-side terminal of the conductive pattern 5.

A method of forming the cover insulating layer 6 is not particularly limited. The cover insulating layer 6 is, for example, formed by a photolithography method. For example, as shown in FIGS. 11A to 12F, a photosensitive cover precursor layer 91 is disposed on one surfaces in the thickness direction of the support sheet 2, the base insulating layer 4, the alignment mark 7, and the conductive pattern 5, and then, the photosensitive cover precursor layer 91 is exposed through a cover photomask 52 as one example of a second photomask to be then developed.

In order to dispose the photosensitive cover precursor layer 91, as shown in FIG. 12A, for example, a precursor composition of the above-described resin having photosensitivity is applied to one surfaces in the thickness direction of the support sheet 2, the base insulating layer 4, the alignment mark 7, and the conductive pattern 5 and if necessary, dried.

Subsequently, as shown in FIGS. 12B to 12E, the one cover photomask 52 is prepared and sequentially moved in the first direction (ref: FIGS. 11A to 11B) to expose the photosensitive cover precursor layer 91 a plurality of times.

As shown in FIG. 11A, the cover photomask 52 includes a first cover photo pattern 53 as one example of a fourth photo pattern, a second cover photo pattern 54 as one example of a fifth photo pattern, and a third cover photo pattern 55 as one example of a sixth photo pattern.

Each of the first cover photo pattern 53, the second cover photo pattern 54, and the third cover photo pattern 55 in the one cover photomask 52 corresponds to the cover one end portion 25, the cover other end portion 26, and the cover intermediate portion 27, respectively in one sheet area 9 (ref: FIG. 4D). In the cover photomask 52, for example, when the photosensitive cover precursor layer 91 is a negative type, it has the light transmitting pattern T corresponding to the cover insulating layer 6 and the light shielding pattern B corresponding to a portion other than the cover insulating layer 6.

Further, the third cover photo pattern 55 includes a cover photo pattern 51 as one example of a plurality of photo patterns disposed adjacent to each other at spaced intervals in the third direction in the one cover photomask 52. The plurality of cover photo patterns 51 sequentially have a fourth cover photo pattern 56, a fifth cover photo pattern 57, a sixth cover photo pattern 58, and a seventh cover photo pattern 59 toward one side in the third direction.

Each of the fourth cover photo pattern 56 to the seventh cover photo pattern 59 corresponds to each of the first cover intermediate portion 27A to the fourth cover intermediate portion 27D (ref: FIG. 4D).

The cover photomask 52 has, for example, the mask frame 67 having a generally rectangular shape when viewed from the top. The cover photomask 52 includes a cover mask one end portion 60A as one example of a first directional one end portion, and a cover mask other end portion 60B as one example of a first directional other end portion at the inside of the mask frame 67.

In the plurality of cover photo patterns 51, a slide pattern obtained by sliding (subjected to parallel movement of) the cover photo pattern first end portion 71 that is a portion located in the cover mask one end portion 60A of the fourth cover photo pattern 56 to the other side in the first direction corresponds to the cover photo pattern second end portion 72 that is a portion located in the cover mask other end portion 60B of the fifth cover photo pattern 57.

The cover photo pattern first end portion 71 includes a cover first portion 73. The cover first portion 73 is located in the intermediate portion in the first direction in the cover photo pattern first end portion 71, and disposed over the entire width direction in the cover photo pattern first end portion 71. Specifically, the cover first portion 73 is located in the central portion in the first direction of the cover photo pattern first end portion 71.

The cover photo pattern second end portion 72 includes a cover second portion 74. The cover second portion 74 is located in the intermediate portion in the first direction in the cover photo pattern second end portion 72, and disposed over the entire width direction in the cover photo pattern second end portion 72. Specifically, the cover second portion 74 is located in the central portion in the first direction of the cover photo pattern second end portion 72.

Then, the cover first portion 73 coincides with the cover second portion 74 when projected in the first direction. That is, the position in the width direction of the cover first portion 73 is the same as the position in the width direction of the cover second portion 74 when projected in the first direction.

Further, a slide pattern obtained by sliding (subjected to parallel movement of) the cover photo pattern first end portion 71 located in the cover mask one end portion 60A of the fifth cover photo pattern 57 to the other side in the first direction coincides with the cover photo pattern second end portion 72 located in the cover mask other end portion 60B of the sixth cover photo pattern 58. Each of the cover photo pattern first end portion 71 of the fifth cover photo pattern 57 and the cover photo pattern second end portion 72 of the sixth cover photo pattern 58 includes each of the cover first portion 73 and the cover second portion 74, respectively. The cover first portion 73 of the fifth cover photo pattern 57 coincides with the cover second portion 74 of the sixth cover photo pattern 58 when projected in the first direction.

Furthermore, a slide pattern obtained by sliding (subjected to parallel movement of) the cover photo pattern first end portion 71 located in the cover mask one end portion 60A of the sixth cover photo pattern 58 to the other side in the first direction coincides with the cover photo pattern second end portion 72 located in the cover mask other end portion 60B of the seventh cover photo pattern 59. Each of the cover photo pattern first end portion 71 of the sixth cover photo pattern 58 and the cover photo pattern second end portion 72 of the seventh cover photo pattern 59 includes each of the cover first portion 73 and the cover second portion 74, respectively. The cover first portion 73 of the sixth cover photo pattern 58 coincides with the cover second portion 74 of the seventh cover photo pattern 59 when projected in the first direction.

In other words, of the plurality of cover photo patterns 51, a slide pattern obtained by sliding (subjected to parallel movement of) the cover photo pattern first end portion 71 of one plurality of cover photo patterns 51 to one side in the first direction coincides with the cover photo pattern second end portion 72 of the other plurality of cover photo patterns 51 adjacent to one side in the third direction of one plurality of cover photo patterns 51.

In the fifth step, the cover photomask 52 is disposed on one side in the thickness direction of the photosensitive cover precursor layer 91, while the cover photomask 52 is aligned using the alignment mark 7.

First, the cover photomask 52 is disposed with respect to the photosensitive cover precursor layer 91 corresponding to one sheet area 9 with the first mark 14 and second mark 15 in one sheet area 9 as a reference.

Subsequently, only the photosensitive cover precursor layer 91 corresponding to the cover photomask 52 is exposed through the cover photomask 52 to form the latent image 68 corresponding to the first cover photo pattern 53 to the third cover photo pattern 55 in the photosensitive cover precursor layer 91.

As shown by the arrow of FIG. 11A, FIG. 11B, the arrow of FIG. 12B, and FIG. 12C, the cover photomask 52 is subsequently moved (slid) to one side in the first direction with respect to the photosensitive cover precursor layer 91, and disposed on one side in the thickness direction of the photosensitive cover precursor layer 91 corresponding to the other sheet area 9 (for example, the second sheet area 9B)

adjacent to one side in the first direction of one sheet area 9 (for example, the first sheet area 9A).

When the cover photomask 52 is moved and disposed with respect to the photosensitive cover precursor layer 91, the cover photomask 52 is disposed in the photosensitive cover precursor layer 91 corresponding to the other sheet area 9 (for example, the second sheet area 9B) with the first mark 14 and the second mark 15 in the other sheet area 9 (for example, the second sheet area 9B) as a reference.

Further in the photosensitive cover precursor layer 91, a portion facing the cover mask one end portion 60A of the cover photomask 52 at the time of the previous exposure is overlapped with a portion facing the cover mask other end portion 60B of the cover photomask 52 at the time of the present exposure.

Further, in the photosensitive cover precursor layer 91, the cover first portion 73 of the cover photomask 52 at the time of the previous exposure is at the same position as the cover second portion 74 of the cover photomask 52 at the time of the present exposure.

Subsequently, the photosensitive cover precursor layer 91 is exposed through the cover photomask 52 after movement to form another latent image 68.

Thereafter, as shown in FIGS. 12D to 12E, the movement of the cover photomask 52, the alignment of the cover photo mask 52, the exposure of the photosensitive cover precursor layer 91, and the formation of the latent image 68 described above are repeated.

As shown in FIG. 12F, thereafter, the photosensitive cover precursor layer 91 is developed and if necessary, heated.

Thus, as shown in FIG. 4D, the cover insulating layer 6 including the cover intermediate portion 27 continuous in the second direction is formed over the plurality of sheet areas 9.

Thus, the plurality of wiring circuit boards 3 including the base insulating layer 4, the conductive pattern 5, and the cover insulating layer 6 are produced.

Thus, the wiring circuit board assembly sheet 1 including the plurality of alignment marks 7 and the plurality of wiring circuit boards 3 is obtained.

(Function and Effect of One Embodiment)

Then, in the producing method described above, as shown in FIG. 8A, each of the first portions 65 of the plurality of photoline patterns 44 coincides with each of the second portions 66 of the plurality of photoline patterns 44 when projected in the first direction. Therefore, as shown in FIG. 4C, the conductive intermediate portion 23 can be continuous in the second direction.

Further, in one embodiment, as shown in FIG. 8A, even when the shape of the first photo pattern 41 and the second photo pattern 42 are afferent from the shape of the third photo pattern 43, as described above, since the first portion 65 coincides with the second portion 66, as shown in FIG. 4C, the conductive intermediate portion 23 can be also continuous in the second direction. As a result, it is possible to form the conductive pattern 5 having excellent reliability, while the conductive one end portion 21 and the conductive other end portion 22 having a different shape from the conductive intermediate portion 23 are provided.

Further, since the one photomask 40 is sequentially moved in the first direction to expose the dry film resist 60 a plurality of times, it is possible to easily form the conductive pattern 5 described above, while the number of components of the production device is reduced.

However, in the dry film resist 60, when a portion facing the first directional one end portion 61 of the one photomask 40 at the time of the n-th time exposure is not overlapped with a portion facing the first directional other end portion 62 of the one photomask 40 at the time of the [n+1]th time, there may be a case where the conductive intermediate portion 23 easily becomes discontinuous, and the reliability of the conductive pattern 5 is reduced.

On the other hand, in this producing method, as shown in FIGS. 8B, and 9C to 9F, since the first directional one end portion 61 and the first directional other end portion 62 described above are overlapped, even when the one photomask 40 is sequentially moved in the first direction, the conductive intermediate portion 23 can be continuous, and therefore, it is possible to suppress a decrease in reliability of the conductive pattern 5.

The conductive pattern 5 having the short length L0 in the second direction of below 300 mm can be formed by photolithography for exposing the one photomask 40 once. However, in the photolithography, there may be a case where the conductive pattern 5 having the long length L0 in the second direction of 300 mm or more cannot be formed.

However, in the producing method, since the photolithography for sequentially moving the one photomask 40 in the first direction to be exposed a plurality of times is carried out, as described above, it is possible to form the conductive pattern 5 having the long length L0 in the second direction, while having excellent reliability.

As shown in FIGS. 6A to 6B, in the third step of forming the base insulating, layer 4, each of the base first portions 38 of the plurality of base photo patterns 83 coincides with each of the base second portions 39 of the plurality of base photo patterns 83 when projected in the first direction. Therefore, as shown in FIG. 3B, the base intermediate portion 19 can be continuous in the second direction.

As shown in FIG. 6A, even when the shape of the first base photo pattern 28 and the second base photo pattern 29 is different from the shape of the third base photo pattern 30, as described above, since the base first portion 38 coincides with the base second portion 39, as shown in FIG. 3B, the base intermediate portion 19 is also continuous in the second direction. As a result, it is possible to form the base insulating layer 4 having the base one end portion 17 and the base other end portion 18 which can have a different shape from the base intermediate portion 19 and having excellent reliability.

Further, since the one base photomask 31 is sequentially moved in the first direction to expose the photosensitive base precursor layer 81 a plurality of times, it is possible to easily form the base insulating layer 4 described above, while the number of components of the production device is reduced.

Further, as shown in FIGS. 11A to 11B, in the fifth step of forming the cover insulating layer 6, each of the cover first portions 73 of the plurality of cover photo patterns 51 coincides with each of the cover second portions 74 of the plurality of third cover photo patterns 55 when projected in the first direction. Therefore, as shown in FIG. 4D, the cover intermediate portion 27 is continuous in the second direction. Further, in one embodiment, as shown in FIG. 11A, even when the shape of the first cover photo pattern 53 and the second cover photo pattern 54 is different from the shape of the third cover photo pattern 55, as described above, since the cover first portion 73 coincides with the cover second portion 74, as shown in FIG. 4D, the cover intermediate portion 27 is also continuous in the second direction. As a result, it is possible to form the cover insulating layer 6 having the cover one end portion 25 and the cover other end portion 26 which can have a different shape from the cover intermediate portion 27 and having excellent reliability.

Further, since the one cover photomask 52 is sequentially moved in the first direction to expose the photosensitive cover precursor layer 91 a plurality of times, it is possible to easily form the cover insulating layer 6 described above, while the number of components of the production device is reduced.

Further, as shown in FIG. 4C, in the wiring circuit board assembly sheet 1, the conductive intermediate portion 23 of the conductive pattern 5 includes the first end edge 11 and the second end edge 12, and the first end edge 11 of the conductive intermediate portion 23 of the first sheet area 9A coincides with the second end edge 12 of the conductive intermediate portion 23 of the second sheet area 9B. Therefore, the conductive intermediate portion 23 can be reliably continuous over the plurality of sheet areas 9. Therefore, the conductive pattern 5 is excellent in reliability.

Since the wiring circuit board assembly sheet 1 includes the alignment mark 7, it is excellent in reliability of the plurality of icing circuit boards 3.

In each of the third step to the fifth step, since the alignment mark 7 is used, each of the base insulating layer 4, the conductive pattern 5, and the cover insulating layer 6 can be accurately formed.

MODIFIED EXAMPLES

In the following modified examples, the same reference numerals are provided for members and steps corresponding to each of those in the above-described one embodiment, and their detailed description is omitted. Each of the modified examples can achieve the same function and effect as that of one embodiment unless otherwise specified. Furthermore, one embodiment and the modified examples thereof can be appropriately used in combination.

As shown in FIG. 13A, in the photomask 40 used in the fourth step, both of the first photoline pattern first end portion 63 and the first photoline pattern second end portion 64 are a straight pattern 75 extending in the first direction. The straight portion 75 is parallel with the width directional both end edges 10.

As shown in FIG. 13B, the conductive intermediate portion 23 of the conductive pattern 5 formed using the photomask 40 described above includes a straight portion 77 extending in the first direction. The straight portion 77 is located in the boundary portion 16.

Figure 14A:
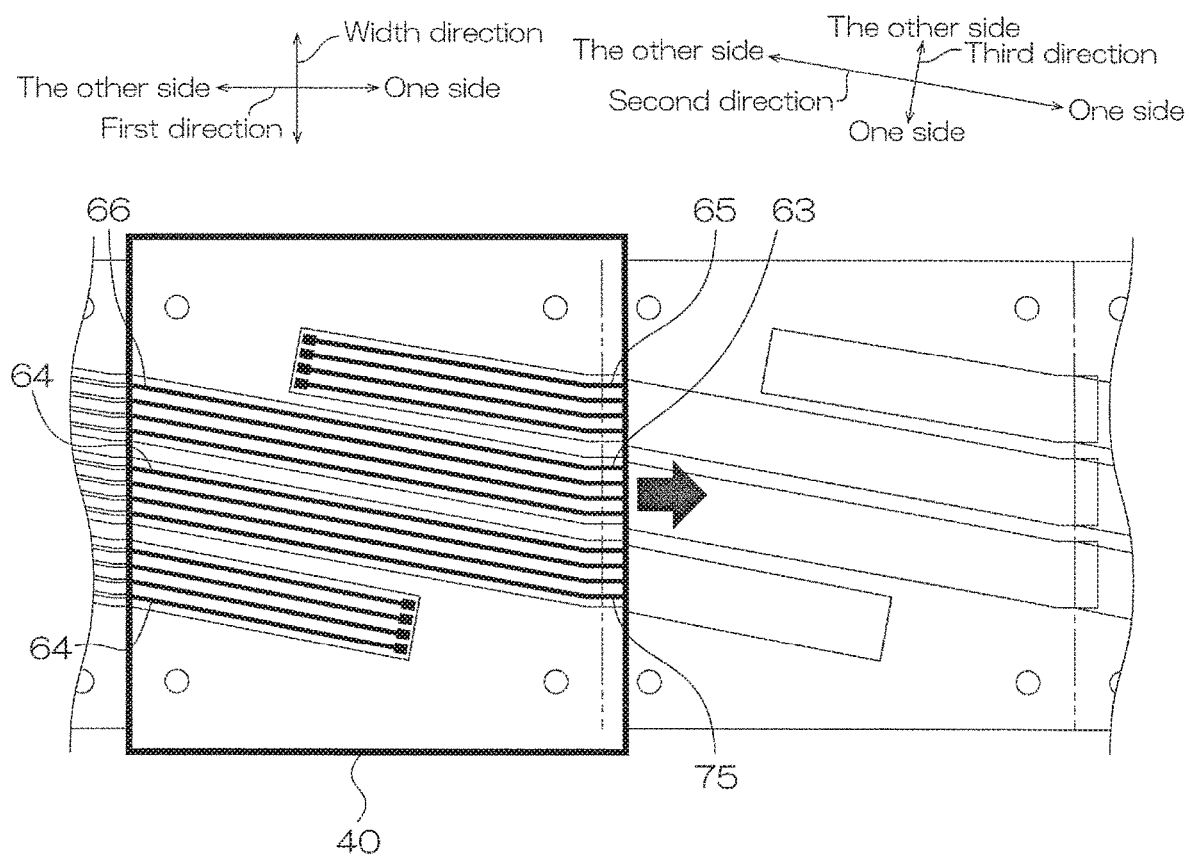
FIG. 14A to 14B show plan views for illustrating a modified example of the fourth step of FIGS. 8A to 8B.
Figure 14B:
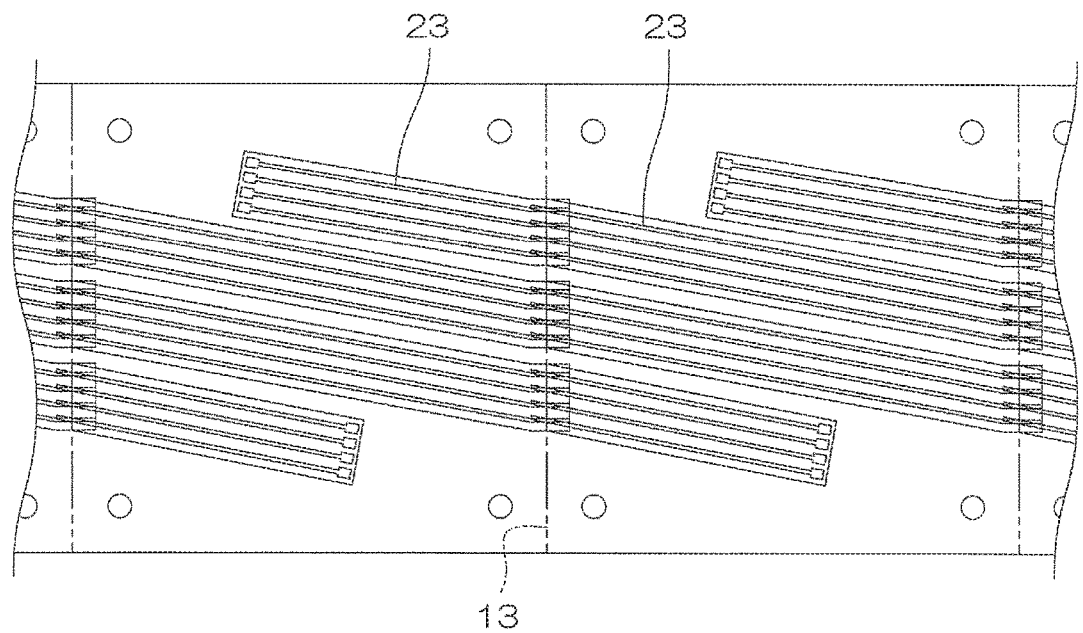

As shown in FIG. 14, in the photomask 40, all of the slide patterns of the first photoline pattern first end portions 63 of the plurality of photoline patterns 44 may not coincide with all of the first photoline pattern second end portions 64 of the plurality of photoline patterns 44.

In this case, for example, the first photoline pattern first end portion 63 is the straight portion 77. The slide pattern obtained by subjecting the straight portion 77 to parallel movement to the other side in the first direction intersects the first photoline pattern second end portion 64. However, the first portion 65 coincides with the second portion 66 at an intersection.

On the other hand, the slide pattern of the first photoline pattern first end portion 63 other than the first portion 65 does not coincide with the first photoline pattern second end portion 64 other than the second portion 66 and deviates in the second direction.

In this modified example, the boundary 13 passes through the intersection described above.

Figure 15:
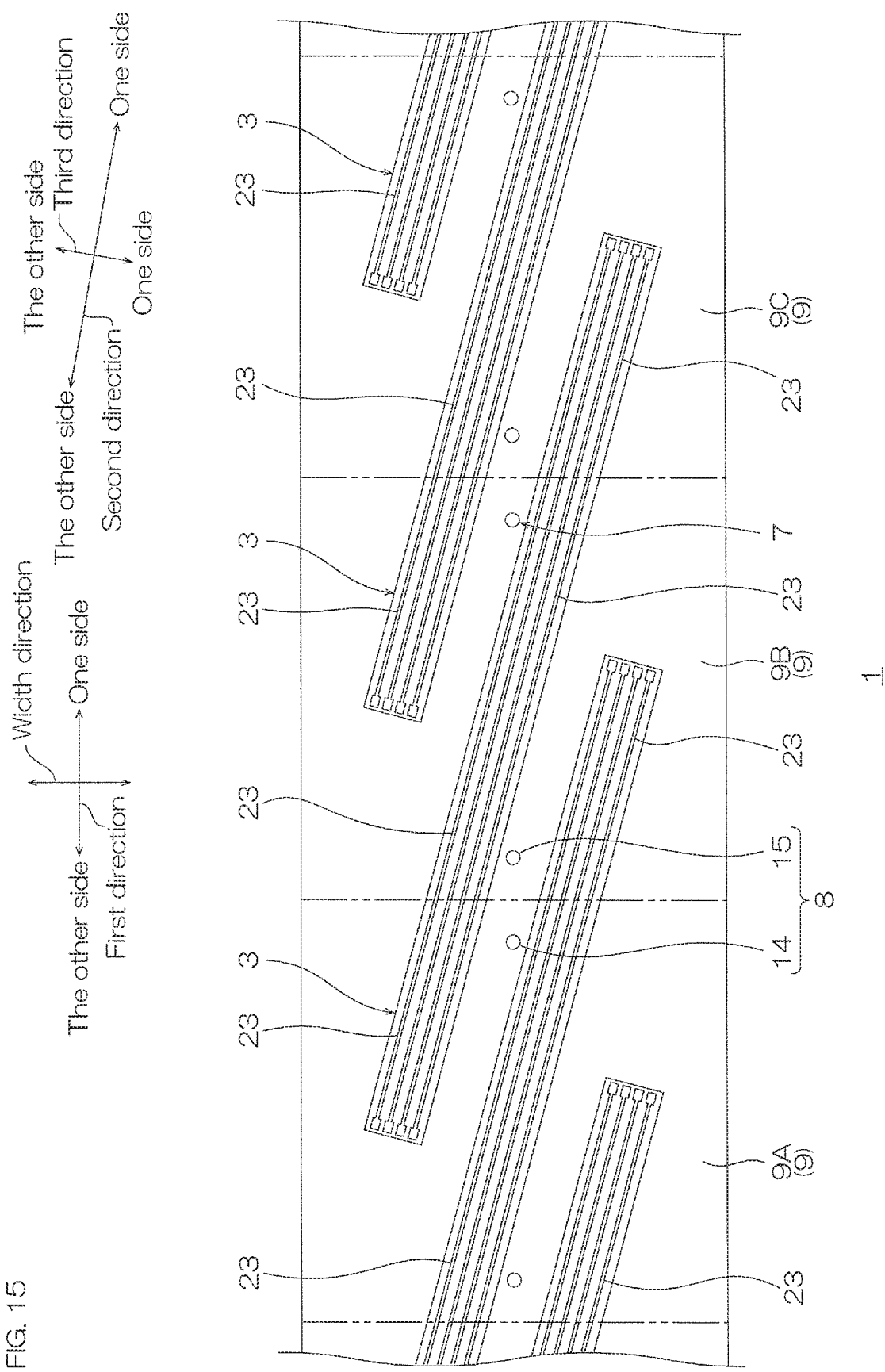
FIG. 15 shows a modified example of the wiring circuit board assembly sheet shown in FIG. 1 and a plan view of a modified example in which a conductive intermediate portion is present over three sheet areas.

As shown in FIG. 15, the conductive intermediate portion 23 in one wiring circuit board 3 is disposed over the continuous three sheet areas 9 (the first sheet area 9A, the second sheet area 9B, and the third sheet area 9C).

Figure 16:
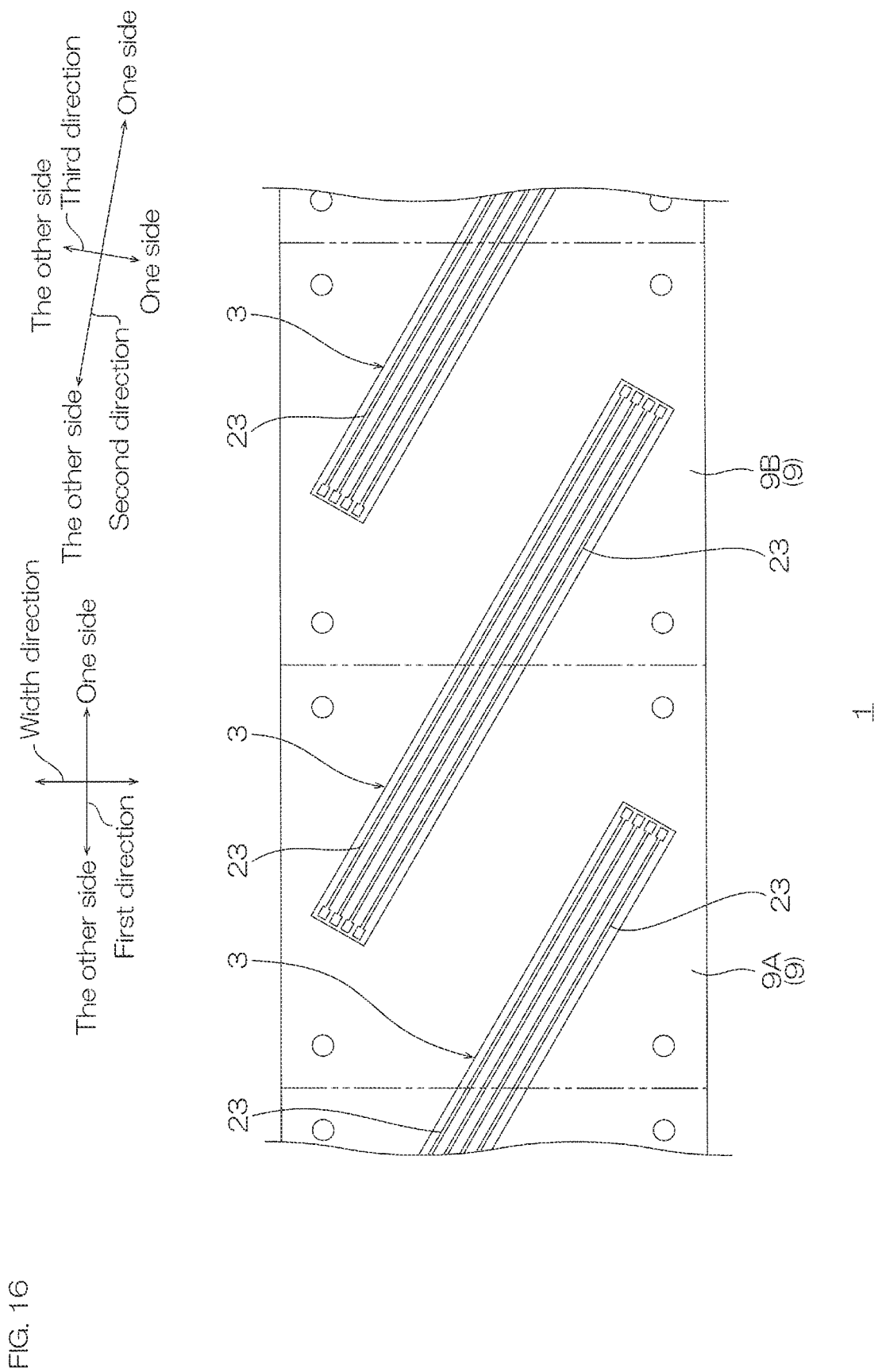
FIG. 16 shows a modified example of the wiring circuit board assembly sheet shown in FIG. 1 and a plan view of a modified example in which a conductive intermediate portion is present over two sheet areas.

As shown in FIG. 16, the conductive intermediate portion 23 in one wiring circuit board 3 is disposed over the continuous two sheet areas 9 (the first sheet area 9A and the second sheet area 9B).

Further, though not shown, the conductive intermediate portion 23 in one wiring circuit board 3 may be disposed over the continuous five or more sheet areas 9.

Although not shown, by using an elongated base sheet in the first direction as the support sheet 2, the conductive pattern 5 and the cover insulating layer 6 are sequentially formed on one side in the thickness direction thereof, and then, by trimming the base sheet, it is also possible to form the base insulating layer 4.

As shown in FIG. 15, it is also possible to dispose the mark set 8 in the intermediate portion (central portion) in the width direction of the support sheet 2.

Figure 17:
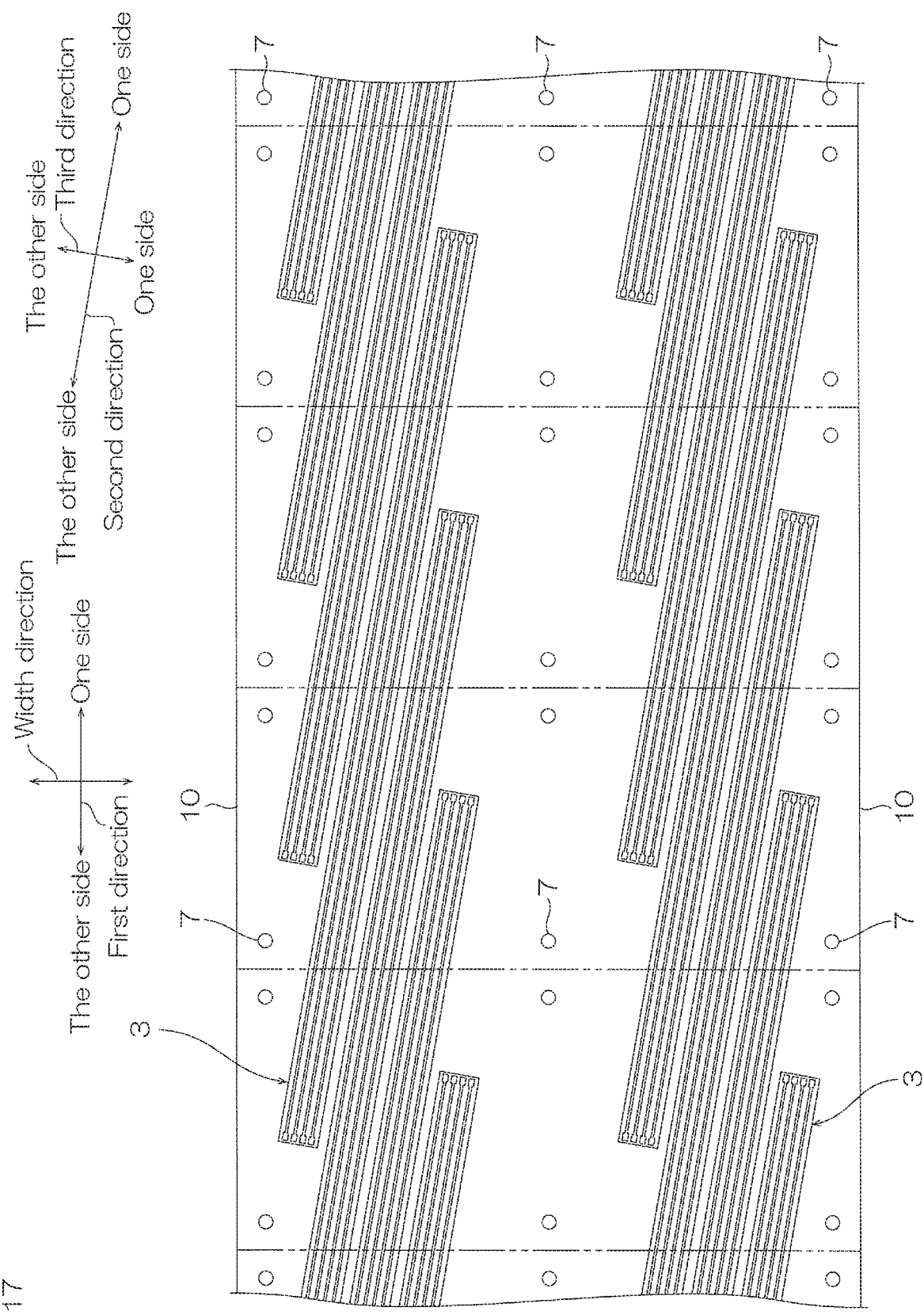
FIG. 17 shows a modified example of the wiring circuit board assembly sheet shown in FIG. 1 and a plan view of a modified example in which a plurality of wiring circuit boards have two rows.

As shown in FIG. 17, the plurality of wiring circuit boards 3 disposed in alignment in the first direction may be in two rows at spaced intervals in the width direction. In the modified example, the alignment mark 7 is disposed in the vicinity of the width directional both end edges 10, and in the central portion between the width directional both end edges 10.

As shown in FIG. 18B, a shape and/or a dimension of the conductive intermediate portion 23 may vary toward one side in the second direction. For example, in FIG. 18, in the conductive intermediate portion 23, a width of the wire becomes thicker toward one side in the second direction. Further, in the conductive intermediate portion 23, an interval between the wires adjacent to each other becomes wider toward one side in the second direction.

As shown in FIG. 18B, a shape of the conductive one end portion 21 is different from that of the conductive other end portion 22. The one-side terminals of the conductive one end portion 21 are disposed in alignment at spaced intervals to each other in the third direction. The terminals of the conductive other end portion 22 are disposed in alignment at spaced intervals to each other in the second direction and the third direction.

However, as shown in FIG. 18A, the slide pattern of the first photoline pattern first end portion 63 coincides with the first photoline pattern second end portion 64. The first portion 65 is located in the same position as the second portion 66 when projected in the first direction.

As shown in FIG. 18B, both end edges in the width direction of the base one end portion 17 are continuous to both end edges in the width direction of the base intermediate portion 19. The base other end portion 18 expands outwardly in the third direction with respect to the base intermediate portion 19.

Further, though not shown, it is also possible to carry out the second step and the third step at the same time. In this case, in the third step, in the alignment of the base photomask 31, the alignment mark 7 described above is not used.

As shown in FIG. 19, the conductive intermediate portion 23 may be curved in a generally S-shape when viewed from the top. Further, though not shown, the conductive intermediate portion 23 may have a folded shape.

Further, in one embodiment, the conductive pattern 5 is formed by an additive method. Alternatively, the conductive pattern 5 can be also formed by a subtractive method. In the subtractive method, a conductive sheet adheres to one surfaces in the thickness direction of the support sheet 2 and the base insulating layer 4, and subsequently, the dry film resist 60 is disposed on one surface in the thickness direction of the conductive sheet. Thereafter, by photolithography in which the one photomask 40 is sequentially moved in the first direction to be exposed a plurality of times, an etching resist is formed in the same pattern as the conductive pattern 5. Thereafter, by etching the conductive sheet exposed from the etching resist, the conductive pattern 5 is formed.

In addition, in the third step, the photosensitive base precursor layer 81 may be exposed a plurality of times using the plurality of base photomasks 31. Furthermore, in the third step, by a method other than the photolithography, for example, the base insulating layer 4 formed in advance into a pattern having the base one end portion 17, the base other end portion 18, and the base intermediate portion 19 can also adhere to the support sheet 2.

In addition, in the fifth step, the photosensitive cover precursor layer 91 may be exposed a plurality of times using the plurality of cover photomasks 52. Furthermore, in the fifth step, by a method other than the photolithography, for example, the cover insulating layer 6 formed in advance into a pattern having the cover one end portion 25, the cover other end portion 26, and the cover intermediate portion 27 can also adhere to the base insulating layer 4 and the conductive pattern 5.

Alternatively, it is also possible to shave the one-side portion in thickness direction of the support sheet 2 to form a recessed portion, or to form a through hole penetrating the support sheet 2 in the thickness direction to form the alignment mark 7 consisting of the through hole. The alignment mark 7 can be also formed by laser irradiation or ink printing (ink jet printing).

In the method for producing the wiring circuit board assembly sheet 1, since the support sheet 2 is elongated, a roll-to-roll method is carried out, and a length in the first direction of an exposure device is usually shorter than that of the support sheet 2, there may be a case where the plurality of alignment marks 7 cannot be formed by one exposure. Therefore, the alignment photomask 20 is sequentially moved toward one side in the first direction to be exposed a plurality of times.

In one embodiment, as shown in FIGS. 5A to 5B (or FIGS. 21A to 21B to be described later), the latent image 68 corresponding to the first mark 14 and the second mark 15 sandwiching the boundary 13 therebetween is formed by one exposure using the one alignment photomask 20.

On the other hand, in the modified example shown in FIGS. 20A to 20E, the latent image 68 corresponding to the first mark 14 and the second mark 15 sandwiching the boundary 13 therebetween is formed by separate exposures.

Figure 20A:
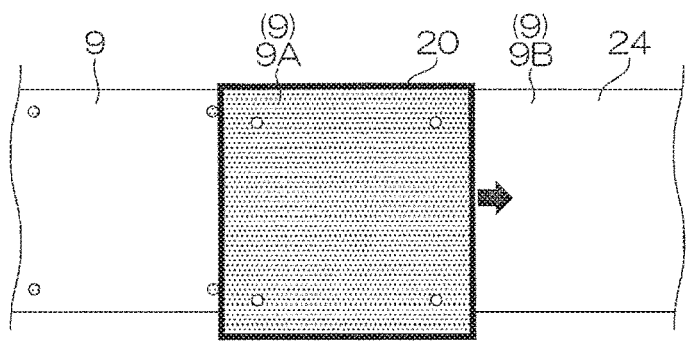
FIGS. 20A to 20E show process views of a modified example of the first step shown in FIGS. 5A to 5B and the fourth step shown in FIGS. 8A to 8B and a modified example in which a first mark and a second mark sandwiching a boundary therebetween are separately formed.
Figure 20B:
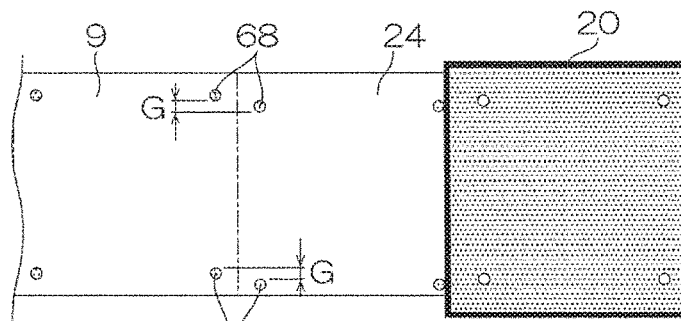

That is, in the modified example, first, as shown in FIG. 20A, the latent image 68 of the first mark 14 and the second mark 15 corresponding to one sheet area 9 (the first sheet area 9A) is formed by exposure through the one alignment photomask 20. Next, as shown in FIG. 20B, the alignment photomask 20 is slid with respect to the photosensitive precursor layer 24 corresponding to the other sheet area 9 (the second sheet area 9B). Thereafter, the latent image 68 of the first mark 14 and the second mark 15 is formed on the photosensitive precursor layer 24 corresponding to the other sheet area 9 (the second sheet area 9B) by exposure through the one alignment photomask 20.

Figure 20C:
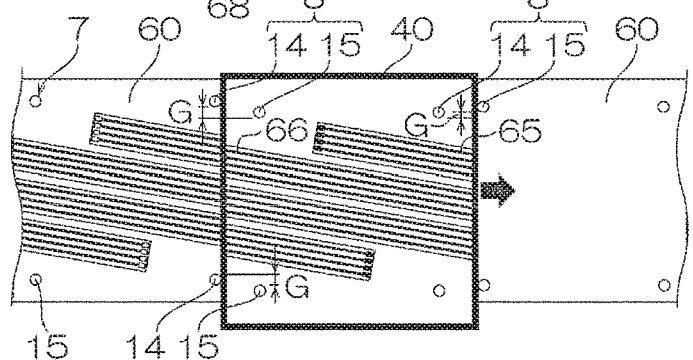
Figure 20D:
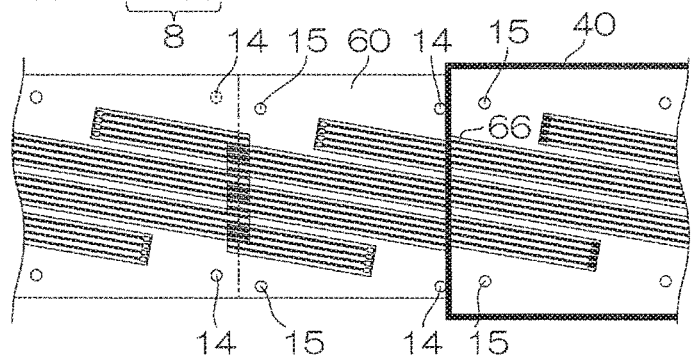
Figure 20E:
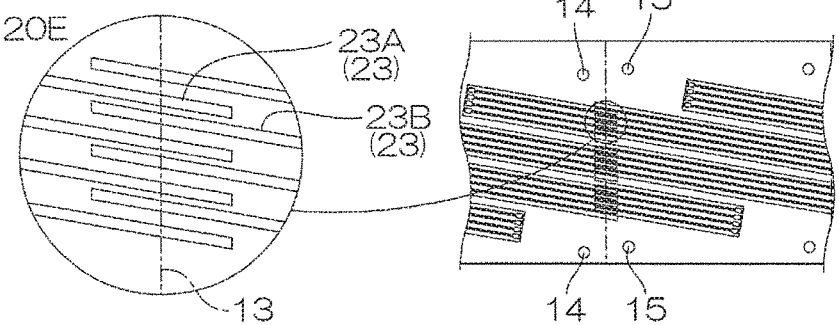

However, in the modified example, in the mark set 8, the second mark 15 may deviate in the width direction with respect to the first mark 14 (occurrence of deviation G). Then, as shown in FIG. 20C, even when the photomask 40 is first aligned to expose the dry film resist 60 using the second mark 15 in one sheet area 9 (the first sheet area 9A), and then, as shown in FIG. 20D, the photomask 40 is moved and aligned again with the dry film resist 60 to be exposed using the first mark 14 in the other sheet area 9 (the second sheet area 9B), the first portion 65 and the second portion 66 do not easily coincide due to the deviation G described above. Then, as shown by an enlarged view of FIG. 20E, the conductive intermediate portion 23 in one sheet area 9 (the first sheet area 9A) may be not easily continuous to the conductive intermediate portion 23 in the other sheet area 9 (the second sheet area 9B).

Figure 21A:
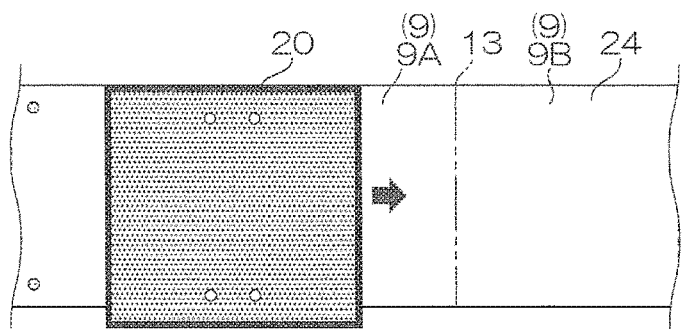
FIGS. 21A to 21B show process views for further illustrating the details of the first step shown in FIGS. 5A to 5B and the fourth step shown in FIGS. 8A to 8B.
Figure 21B:
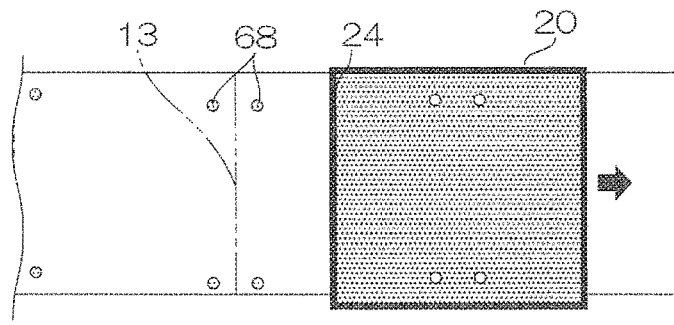
Figure 21C:
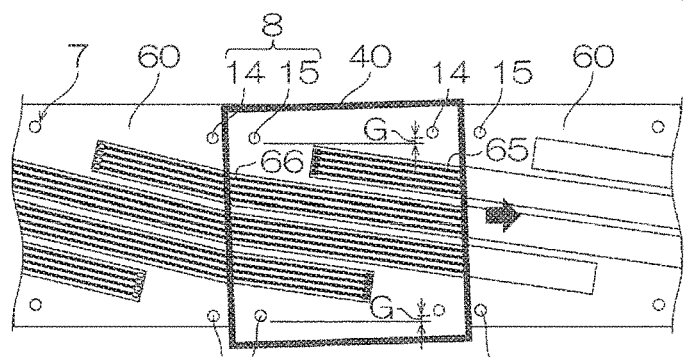
Figure 21D:
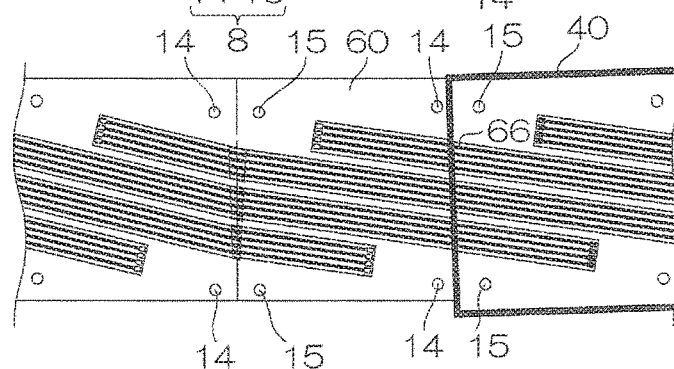
Figure 21E:
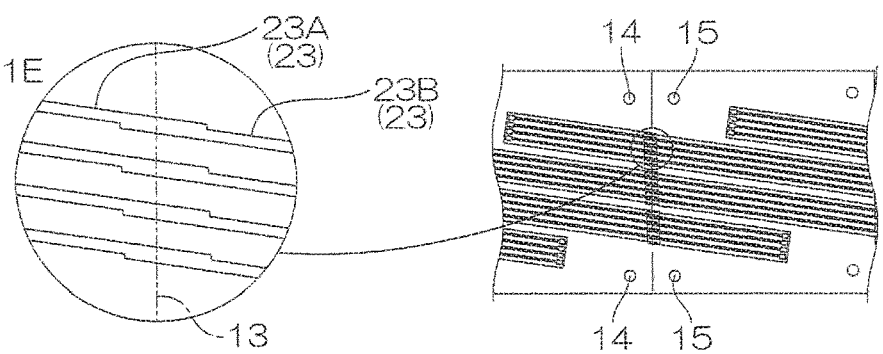

However, in one embodiment, as shown in FIGS. 5A to 5B, the latent image 68 corresponding to the first mark 14 and the second mark 15 sandwiching the boundary 13 therebetween is formed by one exposure, and as shown in FIGS. 21A to 21B, even when the first mark 14 and the second mark 15 corresponding to one sheet area 9 deviate in the width direction and the posture of the one photomask 40 is slightly rotated (ref: a thin arrow of FIG. 21C), the latent image 68 corresponding to the first mark 14 and the second mark 15 sandwiching the boundary 13 therebetween is formed by one exposure, so that the above-described positional deviation can be suppressed. Consequently, as shown by the enlarged view of FIG. 21E, the conductive intermediate portion 23 in one sheet area 9 (the first sheet area 9A) and the conductive intermediate portion 23 in the other sheet area 9 (the second sheet area 9B) can be reliably electrically conducted.

Figure 22A:
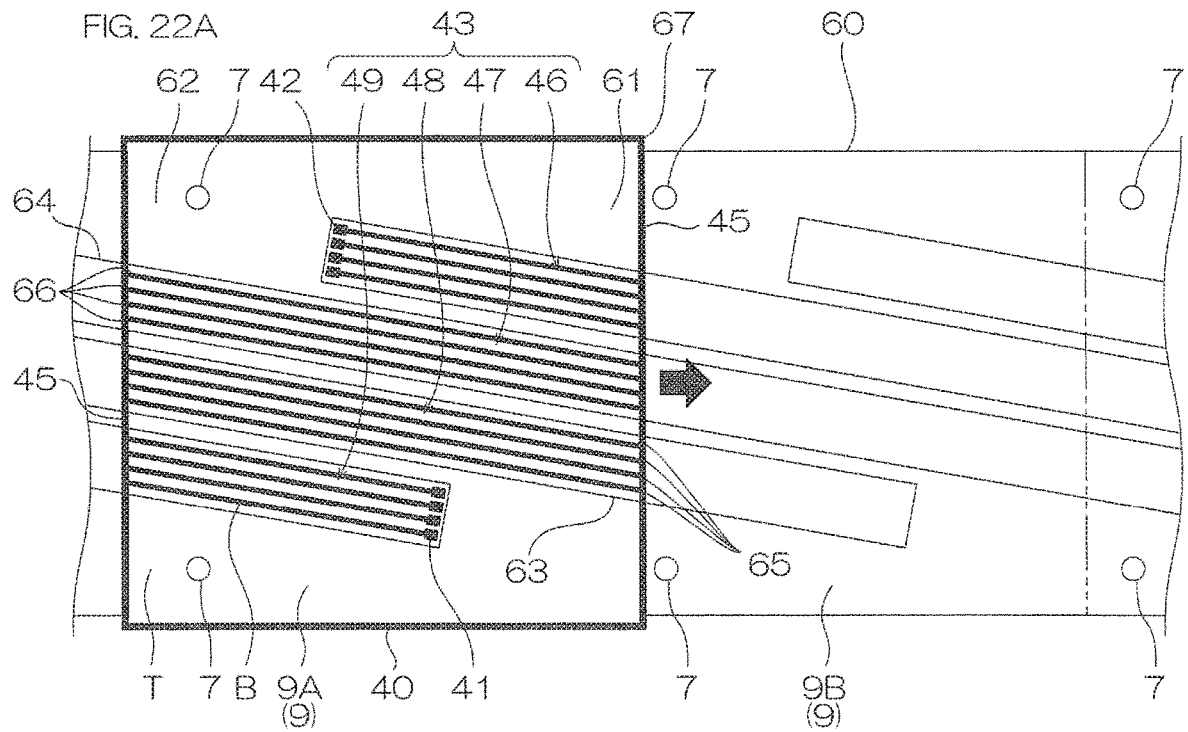
FIGS. 22A to 22B show plan views for illustrating a process explaining a modified example of the fourth step shown in FIG. 4C.
Figure 22B:
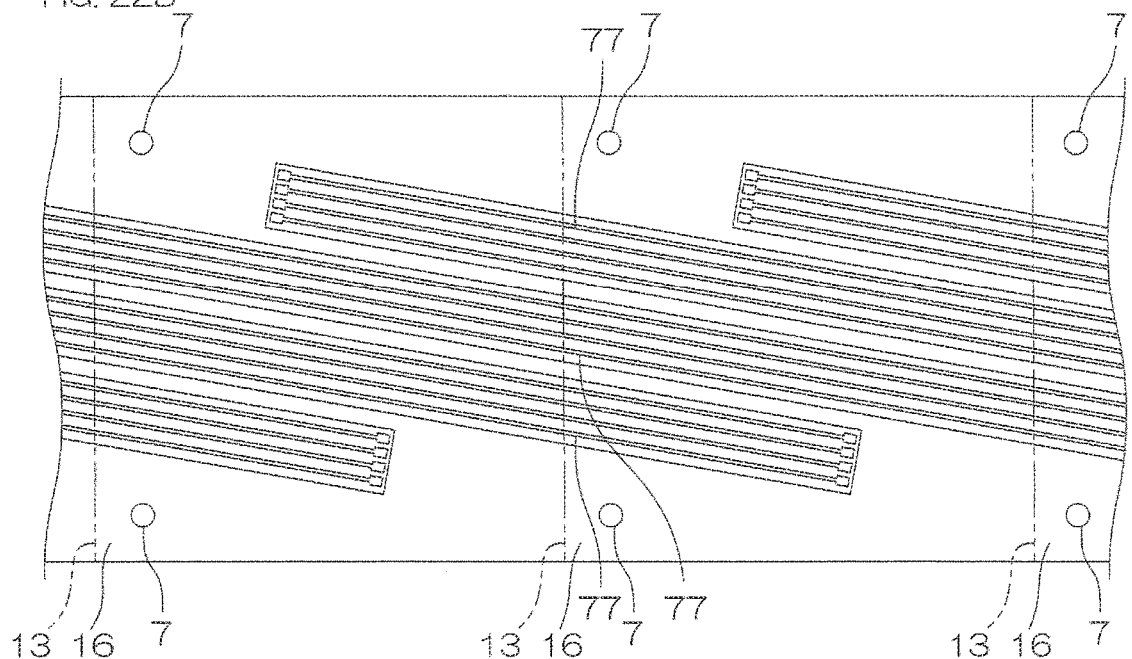

As shown in FIGS. 22A to 22B, the one alignment mark 7 may be provided in the boundary portion 16 at each of the both end portions in the width direction. In this modified example, for example, the alignment mark 7 is provided in the vicinity of one side in the first direction of the boundary 13 at the boundary portion 16.

In the fourth step, the photomask 40 is disposed in the dry film resist 60, while the alignment thereof is carried out using the alignment mark 7.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

DESCRIPTION OF SYMBOLS

1 Wiring circuit board assembly sheet
2 Support sheet
3 Wiring circuit board
4 Base insulating layer (one example of insulating layer)
5 Conductive pattern
6 Cover insulating layer (one example of insulating layer)
7 Alignment mark
9 Sheet area
11 First end edge (one example of the fifth end edge)
12 Second end edge (one example of the sixth end edge)
13 Boundary
16 Boundary portion
17 Base one end portion (one example of insulating one end portion)
18 Base other end portion (one example of insulating other end portion)
19 Base intermediate portion (one example of insulating intermediate portion)
21 Conductive one end portion
22 Conductive other end portion
23 Conductive intermediate portion 25 Cover one end portion (one example of insulating one end portion)
26 Cover other end portion (one example of insulating other end portion)
27 Cover intermediate portion (one example of insulating, intermediate portion)
28 First base photo pattern (one example of the fourth photo pattern)
29 Second base photo pattern (one example of the fifth photo pattern)
30 Third base photo pattern (one example of the sixth photo pattern)
31 Base photo mask
31A Base mask one end portion
31B Base mask other end portion
32 Fourth base photo pattern
33 Fifth base photo pattern
34 Sixth base photo pattern
35 Seventh base photo pattern
36 Base photo pattern first end portion
37 Base photo pattern second end portion
38 Base first portion
39 Base second portion
40 Photo mask
41 First photo pattern
42 Second photo pattern
43 Third photo pattern
44 Plurality of photoline patterns
46 First photoline pattern
47 Second photoline pattern
48 Third photoline pattern
49 Fourth photoline pattern
51 Cover photo pattern (one example of photo pattern)
52 Cover photo mask (one example of photo mask)
53 First cover photo pattern
54 Second cover photo pattern
55 Third cover photo pattern
56 Fourth corner photo pattern
57 Fifth cover photo pattern
58 Sixth cover photo pattern
59 Seventh cover photo pattern
60 Dry film resist
60A doper mask one end portion
60B Cover mask other end portion
61 First directional one end portion
62 First directional other end portion
63 First photoline pattern first end portion
64 First photoline pattern second end portion
65 First portion
66 Second portion
71 Cover photo pattern first end portion
72 Cover photo pattern second end portion
73 Cover first portion
74 Cover second portion
81 Photosensitive base precursor layer (one example of photosensitive precursor layer)
83 Base photo pattern (one example of photo pattern)
91 Photosensitive cover precursor layer (one example of photosensitive precursor layer)
L0 Second directional length of conductive pattern

The invention claimed is:
1. A wiring circuit board assembly sheet comprising:
a support sheet extending in a first direction,
a plurality of wiring circuit boards provided in the support sheet and including a conductive pattern extending in a second direction inclined with respect to the first direction, and
a plurality of sheet areas having the conductive pattern of the same shape and sequentially partitioned in the first direction, wherein
in each of the plurality of sheet areas, the conductive pattern has a conductive one end portion, a conductive other end portion, and a conductive intermediate portion; the plurality of conductive intermediate portions are disposed adjacent to each other at spaced intervals in a third direction perpendicular to the second direction; the plurality of conductive intermediate portions include a fifth end edge located in a first directional one end edge of the sheet area and a sixth end edge located in a first directional other end edge of the sheet area; and
the fifth end edge of one conductive intermediate portion in one sheet area coincides with the sixth end edge of the other conductive intermediate portion adjacent to one conductive intermediate portion in the third direction in the other sheet area adjacent to one sheet area in the first direction.
2. The wiring circuit board assembly sheet according to claim 1, wherein
an alignment mark is provided in a boundary portion of the sheet areas adjacent to each other in the first direction.

\* \* \* \* \*